United States Patent
Li et al.

(10) Patent No.: US 10,115,639 B2
(45) Date of Patent: Oct. 30, 2018

(54) FINFET DEVICE AND METHOD OF FORMING THE SAME

(71) Applicant: Taiwan Semiconductor Manufacturing Company, Ltd., Hsin-Chu (TW)

(72) Inventors: Ping Hung Li, Kaohsiung (TW); Lun-Kuang Tan, Hsin-Chu (TW); Hui-Ying Lu, New Taipei (TW); Chia-Ao Chang, Jinhu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/410,962

(22) Filed: Jan. 20, 2017

(65) Prior Publication Data

US 2018/0151693 A1    May 31, 2018

Related U.S. Application Data

(60) Provisional application No. 62/427,711, filed on Nov. 29, 2016.

(51) Int. Cl.
*H01L 21/8234* (2006.01)
*H01L 21/02* (2006.01)
(Continued)

(52) U.S. Cl.
CPC ............ *H01L 21/823431* (2013.01); *H01L 21/02532* (2013.01); *H01L 21/02592* (2013.01); *H01L 21/2022* (2013.01); *H01L 21/30604* (2013.01); *H01L 21/324* (2013.01); *H01L 21/32055* (2013.01); *H01L 21/32133* (2013.01);
(Continued)

(58) Field of Classification Search
CPC ......... H01L 29/66795; H01L 29/66545; H01L 29/785; H01L 21/823821; H01L 21/823431; H01L 21/32055; H01L 21/32132; H01L 27/0886; H01L 27/0924; H01L 27/1211; H01L 29/7851; H01L 21/02532; H01L 21/30604; H01L 21/324; H01L 21/823437; H01L 21/02592; H01L 21/2022; H01L 21/32133
See application file for complete search history.

(56) References Cited

U.S. PATENT DOCUMENTS 6,495,294 B1 * 12/2002 Yamauchi ......... H01L 21/02381
257/E21.544
7,494,891 B2 * 2/2009 Cheng ............... H01L 29/66181
257/301
(Continued)

*Primary Examiner* — Marvin Payen
*Assistant Examiner* — Jeremy Joy
(74) *Attorney, Agent, or Firm* — Slater Matsil, LLP

(57) ABSTRACT

A method may include depositing a first conductive material in an opening disposed between a first semiconductor structure and a second semiconductor structure, the first conductive material comprising at least one first void. The method further includes removing a portion of the first conductive material to form a trench, the trench exposing the at least one first void and being defined by a remaining portion of the first conductive material; and depositing a second conductive material in the trench, the second conductive material and the remaining portion of the first conductive material forming a dummy gate layer.

20 Claims, 27 Drawing Sheets

(51) Int. Cl.
*H01L 21/306* (2006.01)
*H01L 29/78* (2006.01)
*H01L 21/20* (2006.01)
*H01L 21/324* (2006.01)
*H01L 29/66* (2006.01)
*H01L 21/3205* (2006.01)
*H01L 21/3213* (2006.01)

(52) U.S. Cl.
CPC ........ *H01L 21/823437* (2013.01); *H01L 29/66545* (2013.01); *H01L 29/66795* (2013.01); *H01L 29/7851* (2013.01)

(56) References Cited

U.S. PATENT DOCUMENTS

| | | |
|---|---|---|
| 8,487,378 B2 | 7/2013 | Goto et al. |
| 8,729,634 B2 | 5/2014 | Shen et al. |
| 8,826,213 B1 | 9/2014 | Ho et al. |
| 8,887,106 B2 | 11/2014 | Ho et al. |
| 9,558,940 B2* | 1/2017 | Komori ............ H01L 21/32055 |
| 9,741,821 B1* | 8/2017 | Ching ............... H01L 29/66545 |
| 2003/0139012 A1* | 7/2003 | Yamauchi ......... H01L 29/66674 438/269 |
| 2003/0139102 A1* | 7/2003 | Florander ................ B63H 5/10 440/83 |
| 2004/0241956 A1* | 12/2004 | Eun ................... H01L 21/76224 438/424 |
| 2007/0090437 A1* | 4/2007 | Kim ...................... H01L 27/115 257/301 |
| 2008/0237680 A1* | 10/2008 | Pangal ................. H01L 27/115 257/315 |
| 2008/0277713 A1* | 11/2008 | Maekawa ............ H01L 27/115 257/316 |
| 2009/0267176 A1* | 10/2009 | Yang ................. H01L 27/115 257/506 |
| 2012/0315752 A1* | 12/2012 | Chung ............. H01L 21/76883 438/652 |
| 2013/0292791 A1* | 11/2013 | Lin ........................ H01L 29/06 257/506 |
| 2014/0213034 A1* | 7/2014 | Chang ............... H01L 21/76224 438/424 |
| 2014/0282326 A1 | 9/2014 | Chen et al. |
| 2015/0206949 A1* | 7/2015 | Zhao .................... H01L 29/495 257/410 |
| 2015/0348966 A1* | 12/2015 | Zhao .................... H01L 27/0886 257/401 |
| 2016/0240630 A1* | 8/2016 | Seong ............... H01L 29/66545 |
| 2016/0322473 A1* | 11/2016 | JangJian ............ H01L 29/66545 |
| 2017/0033178 A1* | 2/2017 | Krishnan .......... H01L 21/02675 |
| 2017/0092741 A1* | 3/2017 | Chang ............... H01L 29/66545 |

\* cited by examiner

FINFET DEVICE AND METHOD OF FORMING THE SAME

PRIORITY CLAIM AND CROSS-REFERENCE

This application claims the benefit of the following provisionally filed U.S. patent application Ser. No. 62/427,711, filed Nov. 29, 2016, and entitled "FINfet Device and Method of Forming the Same" which application is hereby incorporated herein by reference.

BACKGROUND

The semiconductor integrated circuit (IC) industry has experienced rapid growth. Over the course of this growth, functional density of the devices has generally increased while the device feature size or geometry has decreased. This scaling down process generally provides benefits by increasing production efficiency, lowering costs, and/or improving performance. Such scaling down has also increased the complexities of processing and manufacturing ICs and, for these advances to be realized similar developments in IC fabrication are needed.

Likewise, the demand for increased performance and shrinking geometry from ICs has brought the introduction of multi-gate devices. These multi-gate devices include multi-gate fin-type transistors, also referred to as fin field-effect transistor (FinFET) devices, because the channel is formed on a "fin" that extends from the substrate. FinFET devices may allow for shrinking the gate width of device while providing a gate on the sides and/or top of the fin including the channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
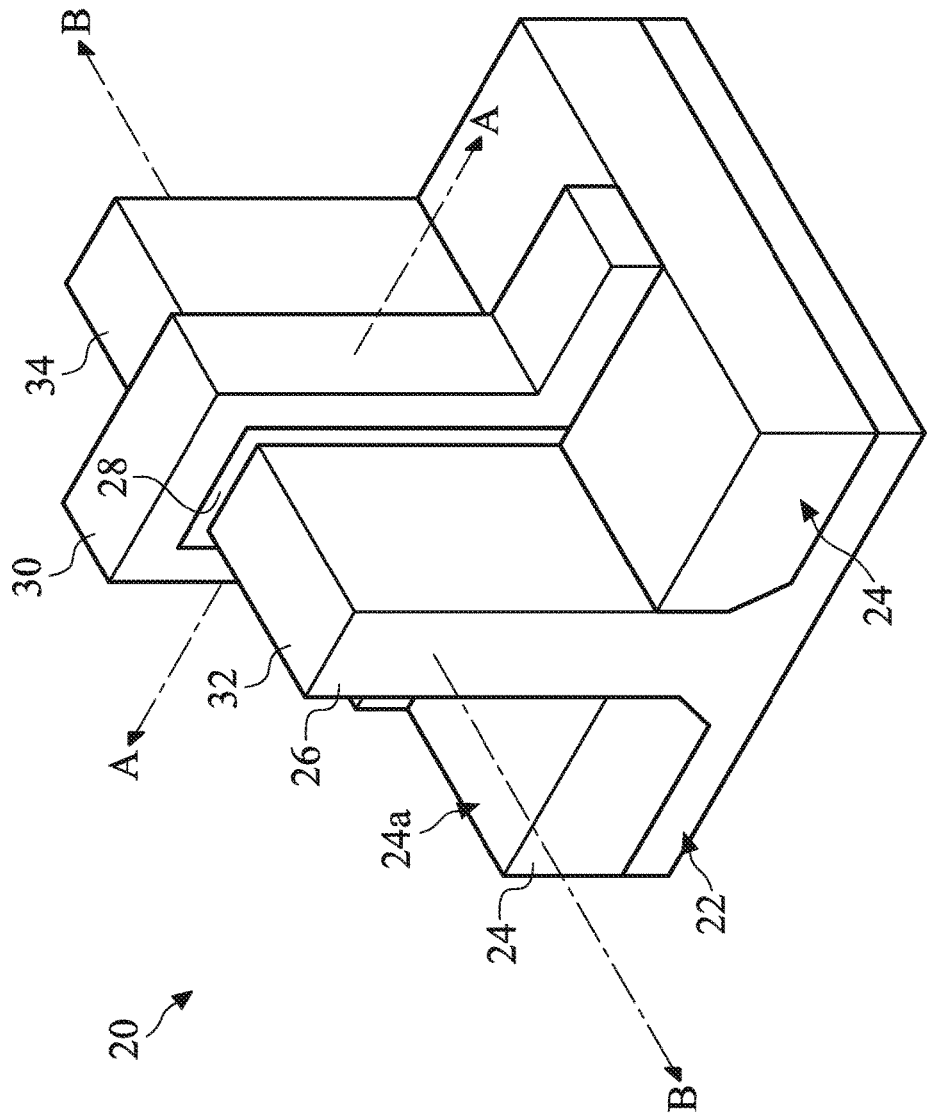
FIG. 1 is an example of a generic fin Field-Effect Transistor (finFET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (finFETs) and methods of forming the same are provided in accordance with various embodiments. Intermediate stages of forming finFETs are illustrated. Some embodiments discussed herein are discussed in the context of finFETs formed using a gate-last process. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Some embodiments may achieve advantages. An embodiment method is provided such that a sacrificial dummy gate layer that is substantially free from voids is formed. The sacrificial dummy gate layer may subsequently be removed in a replacement gate process. As semiconductor process technology advances beyond the sub-20 nm node, the embodiment method may be needed so as to provide better gap-filling capabilities than conventional methods and to reduce or substantially eliminate voids formed in a sacrificial dummy gate layer. Due to the reduction or substantial elimination of voids in the sacrificial dummy gate layer, formation of residue (e.g. SiN residue) during or after removal of sacrificial dummy gate layer may be reduced or avoided, thereby improving manufacturing yield. The embodiment method of forming the sacrificial dummy gate layer may be applied to trenches located between neighboring finFETs that have a high aspect ratio (e.g. greater than or equal to about 7). The embodiment method of forming the sacrificial dummy gate layer may also be compatible with currently-available tools and processes such that new tool evaluation, calibration, and manufacture are avoided. Additionally, the embodiment method avoids use of precursor gases that may include at least one of silane ($SiH_4$), disilane ($Si_2H_6$), and dichlorosilane ($SiH_2Cl_2$), thereby preventing an increase in the cost of manufacturing semiconductor devices having finFETs.

FIG. 1 illustrates a finFET 20 in a three-dimensional view, according to an embodiment. The finFET 20 includes a fin 26 on a substrate 22. Fin 26 may provide an active region where one or more devices are formed. The finFET 20 also includes isolation regions 24. The fin 26 protrudes from the substrate 22 and extends out of a plane formed by a major surface 24a of the isolation regions 24. In the example of FIG. 1, the fin 26 is also located and extends between neighboring isolation regions 24. A gate dielectric 28 lines a portion of the fin 26 (e.g. a portion of the sidewalls of the fin 26). The gate dielectric 28 is also formed over a top surface of the fin 26 (e.g. a surface of the fin 26 that is farthest from and directed away from the substrate 22). A gate electrode 30 is disposed over the gate dielectric 28 and may also covers a portion of the major surface 24a of the isolation regions 24. Portions of the fin 26 that are not covered by the gate dielectric 28 or the gate electrode 30 may form source/drain regions 32 and 34. As shown in FIG. 1, source/drain regions 32 and 34 are disposed at opposite sides of the fin 26 with respect to the gate dielectric 28 and gate electrode 30. FIG. 1 further illustrates reference cross-sections that are used in later figures. Cross-section A-A is across a channel, the gate dielectric 28, and the gate electrode 30 of the finFET 20. In some embodiments, cross-section A-A is along a transverse axis of the fin 26. Cross-section B-B is perpendicular to cross-section A-A and is along a longitudinal axis of the fin 26 and in a direction of, for example, a current flow between the source/drain regions 32 and 34. Subsequent figures refer to these reference cross-sections for clarity.

FIGS. 2 through 24 are cross-sectional views of intermediate stages in the manufacturing of finFETs 20, according to an embodiment. FIGS. 2, 3A, 4A, 5 through 11, and 12A illustrate reference cross-section A-A illustrated in FIG. 1, except for multiple fins. FIGS. 3B, 4B, 12B, and 13 through 24 illustrate reference cross-section B-B illustrated in FIG. 1, except for multiple finFETs.

Figure 2:
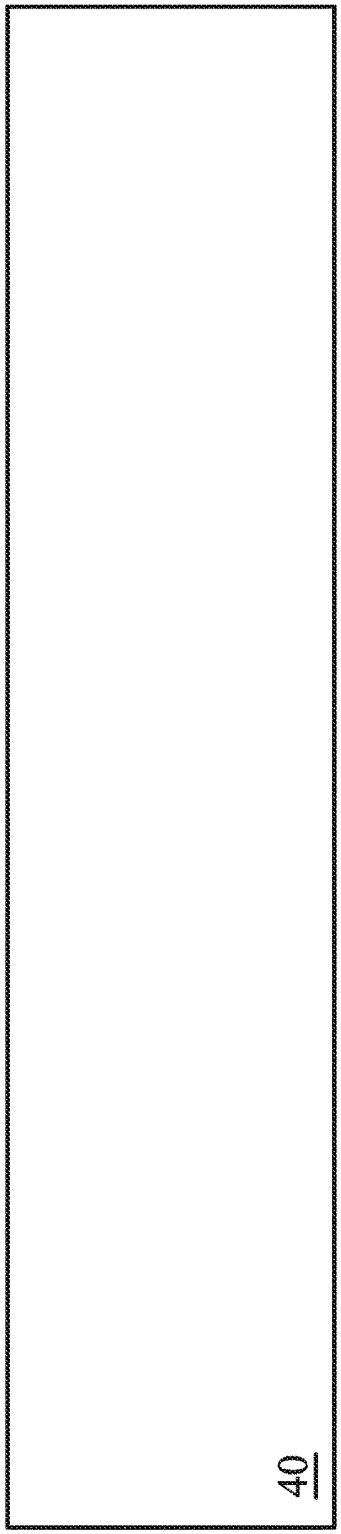
FIGS. 2, 3A, 3B, 4A, 4B, 5 through 11, 12A, 12B, and 13 through 24 are cross-sectional views of intermediate stages in the manufacturing of finFETs, in accordance with some embodiments.

FIG. 2 illustrates a substrate 40, which may be identified with substrate 22 in FIG. 1. Substrate 40 may be a semiconductor substrate, such as a bulk semiconductor substrate, a semiconductor-on-insulator (SOI) substrate, a multi-layered or gradient substrate, or the like. Substrate 40 may include a semiconductor material, such as an elemental semiconductor including Si and Ge; a compound or alloy semiconductor including at least one of SiC, SiGe, GaAs, GaP, GaAsP, AlInAs, AlGaAs, GaInAs, InAs, GaInP, InP, InSb, or GaInAsP; or a combination thereof. Substrate 40 may be doped or un-doped. In a specific example, substrate 40 is a bulk silicon substrate.

Figure 3A:
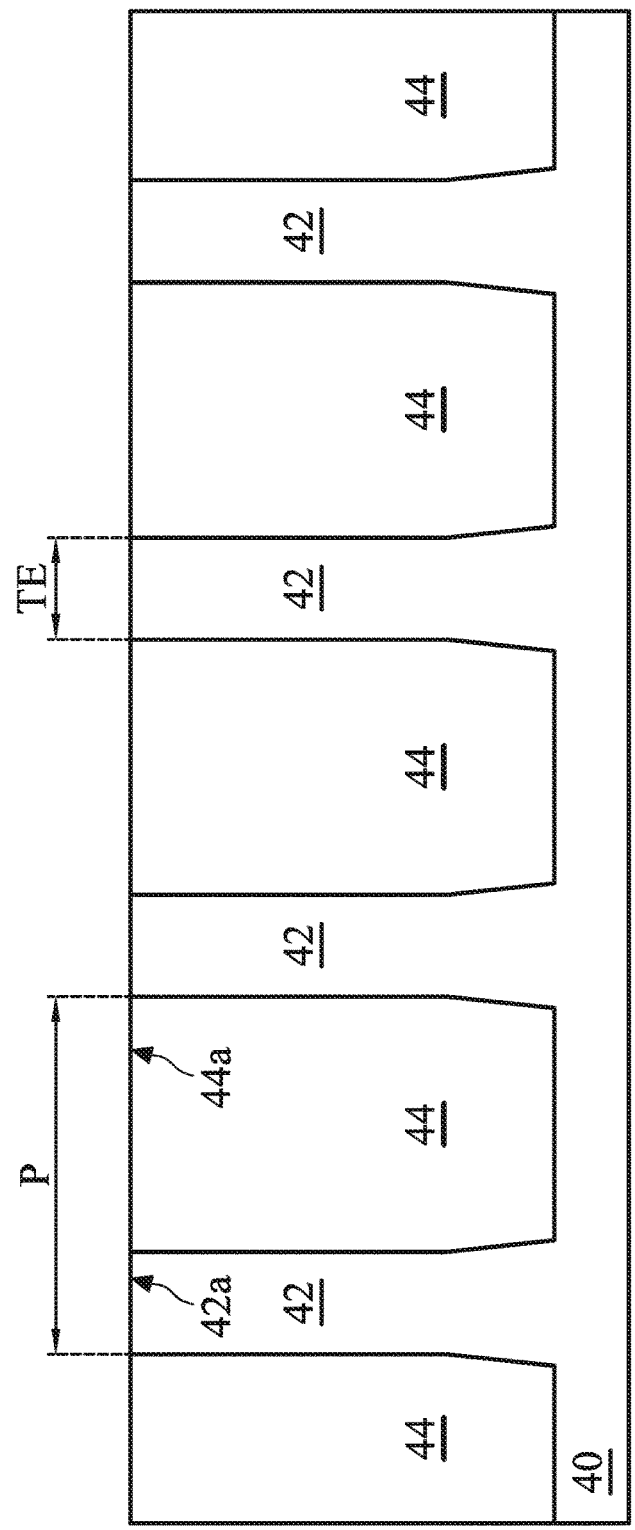
Figure 3B:
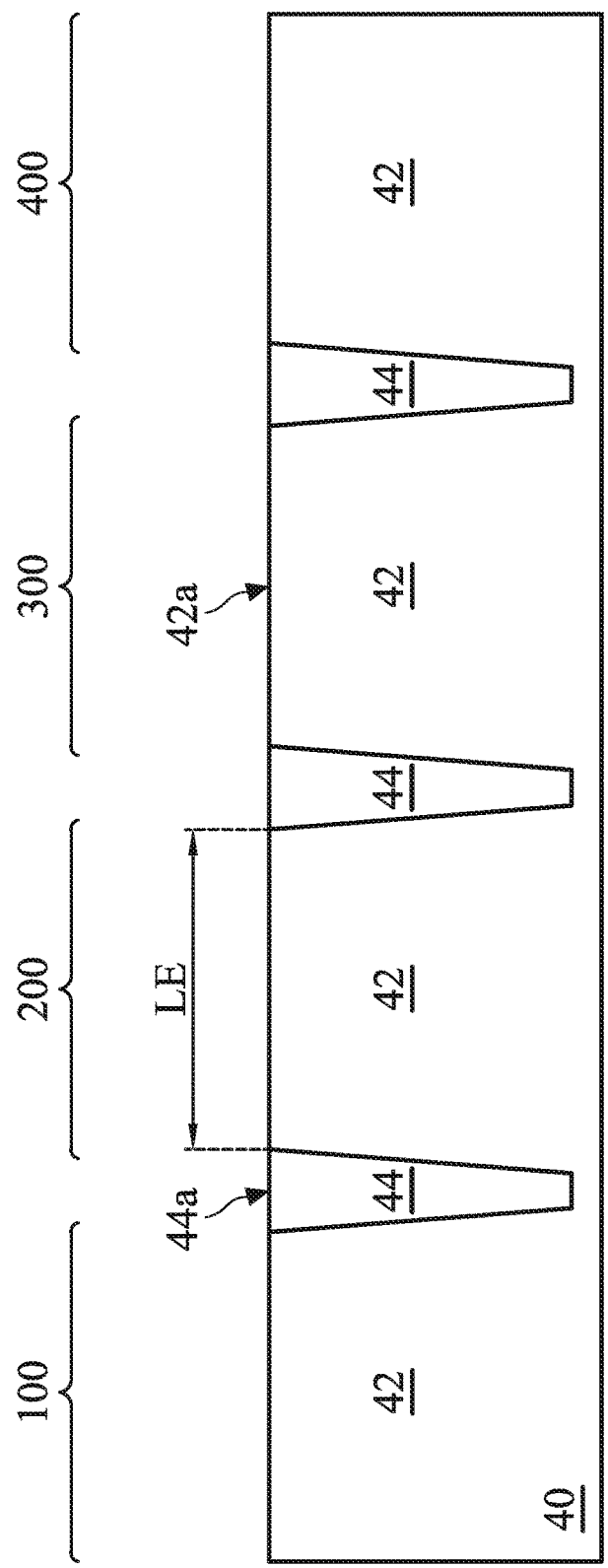

FIGS. 3A and 3B illustrate the formation of fins 42 and isolation regions 44, in accordance with an embodiment. Each of the fins 42 shown in FIGS. 3A and 3B may be the fin 26 shown in FIG. 1 or may be an intermediate stage in the manufacturing of the fin 26 shown in FIG. 1. Similarly, the isolation regions 44 shown in FIGS. 3A and 3B may be the isolation regions 24 shown in FIG. 1 or may be an intermediate stage in the manufacturing of the isolation regions 24 shown in FIG. 1.

In FIGS. 3A and 3B, fins 42 are formed from and protrude out of substrate 40. In some embodiments, fins 42 may be formed by etching trenches in substrate 40. A photolithography process may be used to form fins 42. The photolithography process may include forming a photoresist layer (also referred to as resist, which is not shown in FIGS. 3A and 3B) overlying substrate 40, exposing the resist to a patterning process, performing post-exposure bake processes, and developing the resist to form a masking element including the resist. The masking element may then be used to protect regions of substrate 40 while an etch process forms recesses into substrate 40, leaving fins 42 extending from substrate 40. The etching may be any acceptable etch process, such as a reactive ion etch (RIE), neutral beam etch (NBE), the like, or a combination thereof. The etch may be anisotropic. As shown in FIGS. 3A and 3B, each of the fins 42 may have a transverse extent TE (e.g. a fin thickness, measured along the transverse axis of the fins 42) and a longitudinal extent LE (e.g. a fin length, measured along the longitudinal axis of the fins 42). Each of the fins 42 may have a top surface 42a. The top surfaces 42a of the fins 42 may be major surfaces of the fins 42 farthest from and directed away from substrate 40. In some embodiments, such as in the example of FIG. 3A, the transverse extent TE of a respective fin 42 may be a measure of the lateral extent (e.g. widest transverse extent) of the respective fin 42 at the top surface 42a of the respective fin 42.

Further in FIGS. 3A and 3B, an insulation material is formed between neighboring fins 42 to form isolation regions 44. The insulation material may be an oxide, such as silicon oxide, a nitride, the like, or a combination thereof. The insulation material may be formed by a high density plasma chemical vapor deposition (HDP-CVD), a flowable CVD (FCVD) (e.g. a CVD-based material deposition in a remote plasma system and post curing to make it convert to another material, such as an oxide), the like, or a combination thereof. Other insulation materials formed by any acceptable process may be used. As an example, the insulation material of isolation regions 44 may include at least one of silicon oxide, silicon nitride, silicon oxynitride, fluoride-doped silicate glass (FSG), a low-k dielectric material, or other suitable insulating material.

As semiconductor process technology advances beyond the sub-20 nm node, reduced feature size poses challenges for semiconductor manufacturing. For example, referring to FIG. 3A, for an advanced process technology (e.g. beyond the sub-20 nm node), a pitch P of the fins 42 (e.g. the distance between neighboring fins 42, such as immediately adjacent fins 42, for example) may be smaller than about 20 nm (e.g. less than or equal to about 10 nm), and the transverse extent TE of each fin 42 may be smaller than about 10 nm (e.g. between about 7 nm to about 8 nm). As such, the space between neighboring fins 42 (which may be referred to as trenches) may have a high depth-to-width ratio, which may be referred to as an aspect ratio. In some embodiments, the aspect ratio of the trenches located between neighboring fins 42 may be greater than or equal to about 7. Conventional deposition methods may not perform well for forming isolation regions 44 in trenches with high aspect ratios. However, FCVD has gained popularity due to its ability to fill trenches having an aspect ratio of 7:1 or more. An FCVD process forms flowable dielectric films, which can flow to fill the trenches between neighboring fins 42. Usually, various chemistries are added to the precursors to allow the deposited film to flow. In some examples, nitrogen hydride bonds are added. After the flowable film is deposited, it may be cured and then annealed to remove the added chemistry to form an insulating material (e.g. silicon oxide).

In some embodiments of the FCVD process used to form isolation regions 44, a first silicon-containing precursor is introduced into a deposition chamber with substrate 40 and fins 42 present. In some embodiments, the silicon-containing precursor is a silylamine, such as trisilylamine (TSA), disilylamine (DSA), or a combination thereof. One or more carrier gases may also be included with the silicon-containing precursor. The carrier gases may include helium (He), argon (Ar), nitrogen ($N_2$), the like, or a combination thereof. A second precursor is subsequently provided to the deposition chamber. In some embodiments, the second precursor is a nitrogen-containing precursor. The nitrogen-containing precursor may include $NH_3$, $N_2$, the like, or a combination thereof. In some embodiments, the nitrogen-containing precursor is activated into plasma in a remote plasma system (RPS) outside of the deposition chamber. An oxygen source gas, such as $O_2$ or the like may be included with the nitrogen-containing precursor and activated into plasma in the RPS. Plasma generated in the RPS is carried into the deposition chamber by a carrier gas, which includes He, Ar, $N_2$, the like, or a combination thereof, in some embodiments.

In the deposition chamber, the silicon-containing precursor and the nitrogen-containing precursor mix and react to deposit a film containing silicon and nitrogen on substrate 40 and fins 42. In some embodiments, the deposited film has flowable characteristics. The flowable nature of the deposited film allows the film to flow into the gaps or trenches between adjacent fins 42. The deposited film is cured by, e.g., an anneal process. In some embodiments, the anneal process is performed at a temperature between about 500° C. to about 600° C. The anneal process may include one or more anneal steps performed in series, for example. In various embodiments, the deposited film turns into oxide (e.g., silicon oxide) after the anneal steps, thereby forming the isolation regions 44.

Further in FIGS. 3A and 3B, a planarization process, such as a chemical mechanical polish (CMP), may be performed to remove any excess insulation material of isolation regions 44 formed over top surfaces 42a of the fins 42. As shown in the example of FIGS. 3A and 3B, the planarization process may result in top surfaces 44a of the isolation regions 44 and top surfaces 42a of the fins 42 being co-planar, within process variations. The top surfaces 44a of the isolation regions 44 may be major surfaces of the isolation regions 44 farthest from and directed away from substrate 40.

Although not specifically illustrated, appropriate wells may be formed in at least one of the fins 42 or the substrate 40. For example, a p-well may be formed in a first region 100 and a second region 200 of the substrate 40 (illustrated in FIG. 3B and subsequent figures) where n-type devices, such as n-type finFETs, are to be formed, while an n-well may be formed in a third region 300 and a fourth region 400 of the substrate 40 (illustrated in FIG. 3B and subsequent figures) where p-type devices, such as p-type finFETs, are to be formed.

For example, to form a p-well in the first region 100 and the second region 200, a photoresist (not shown in FIGS. 3A and 3B) may be formed over the fins 42 and the isolation regions 44 in the first region 100, second region 200, third region 300, and fourth region 400. The photoresist may subsequently be patterned to expose the first region 100 and the second region 200 of the substrate 40, while leaving the third region 300 and the fourth region 400 covered by the photoresist. The photoresist may be formed by using a spin-on technique and may be patterned using acceptable photolithography techniques. Once the photoresist is patterned, a p-type impurity implant may be performed in the first region 100 and the second region 200, with the photoresist acting as a mask to substantially prevent p-type impurities from being implanted into the third region 300 and the fourth region 400. The p-type impurities may be boron, $BF_2$, or the like implanted in the first region 100 and the second region 200 to a concentration of equal to or less than $10^{18}$ cm$^{-3}$, such as between about $10^{17}$ cm$^{-3}$ and about $10^{18}$ cm$^{-3}$. After the implantation, the photoresist may be removed, such as by an acceptable ashing process, for example.

Furthermore, to form an n-well in the third region 300 and the fourth region 400, a photoresist may be formed over the fins 42 and the isolation regions 44 in the first region 100, second region 200, third region 300, and fourth region 400. The photoresist may be patterned to expose the third region 300 and the fourth region 400 of the substrate 40, while leaving the first region 100 and the second region 200 covered by the photoresist. The photoresist may be formed by using a spin-on technique and may be patterned using acceptable photolithography techniques. Once the photoresist is patterned, an n-type impurity implant may be performed in the third region 300 and the fourth region 400, with the photoresist acting as a mask to substantially prevent n-type impurities from being implanted into the first region 100 and the second region 200. The n-type impurities may be phosphorus, arsenic, or the like implanted in the third region 300 and the fourth region 400 to a concentration of equal to or less than $10^{18}$ cm$^{-3}$, such as between about $10^{17}$ cm$^{-3}$ and about $10^{18}$ cm$^{-3}$. After the implantation, the photoresist may be removed, such as by an acceptable ashing process, for example.

After the implantation of the p-type and n-type impurities, an anneal may be performed to activate the p-type and n-type impurities that were implanted. The annealed implantations may form a p-well in the first region 100 and the second region 200, and an n-well in the third region 300 and the fourth region 400.

Figure 4A:
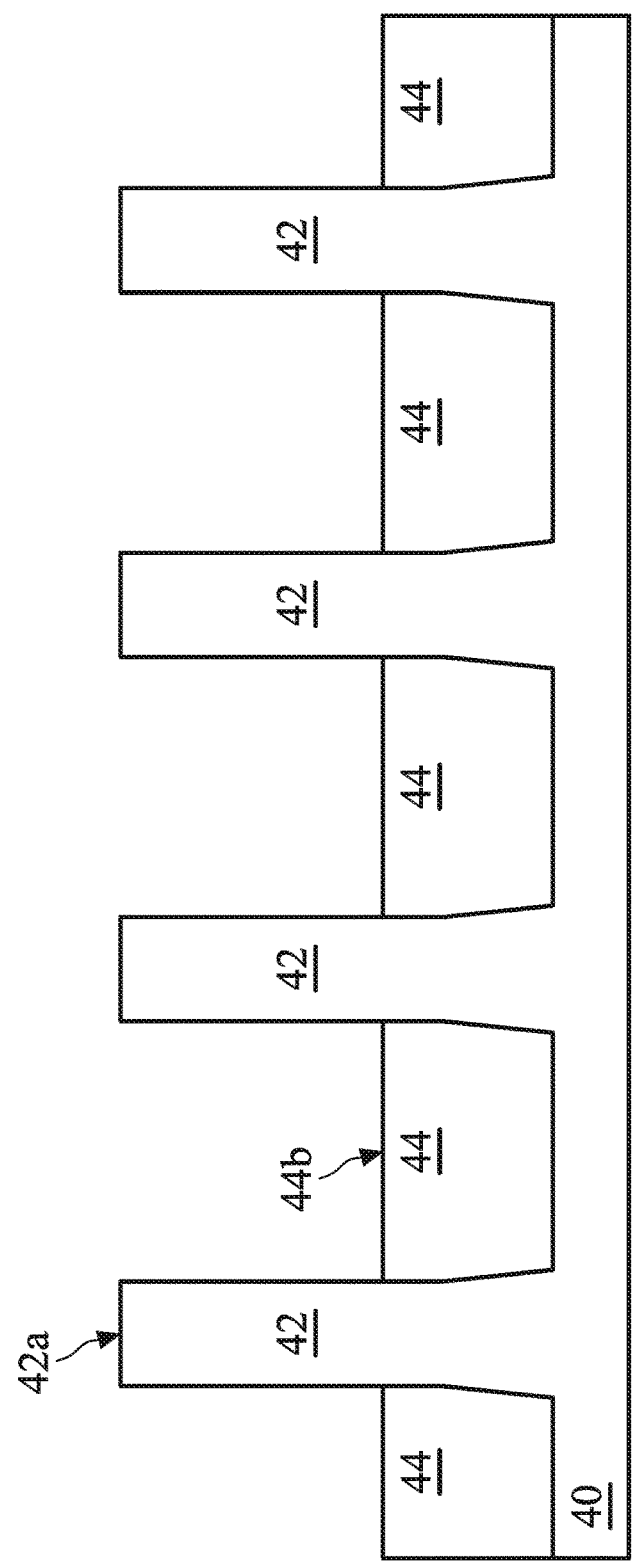
Figure 4B:
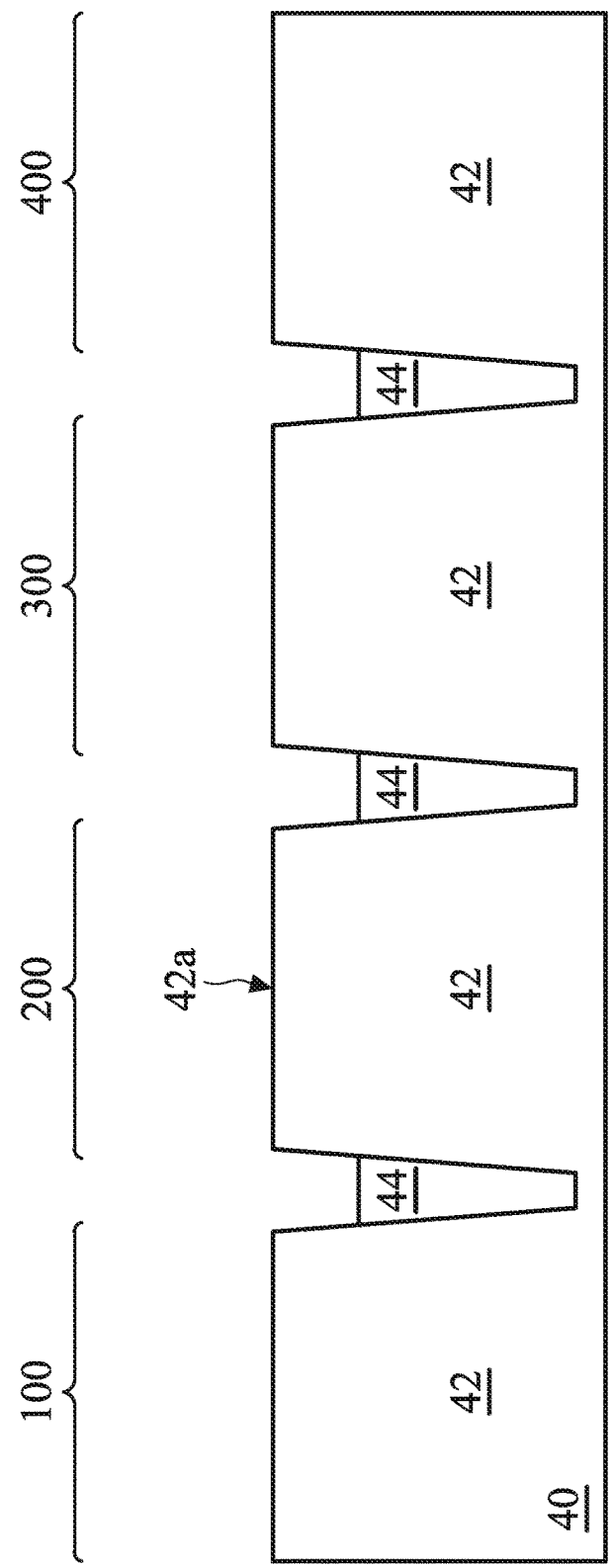

Referring to FIGS. 4A and 4B, isolation regions 44 may be recessed to form shallow trench isolation (STI) regions. As an example, the top surfaces 44a of isolation regions 44 shown in FIGS. 3A and 3B may be recessed to form top surfaces 44b shown in FIGS. 4A and 4B. The isolation regions 44 are recessed such that the fins 42 protrude out of a plane formed by the top surfaces 44b of the isolation regions 44. The top surfaces 44b of the isolation regions 44 may be major surfaces of the isolation regions 44 farthest from and directed away from the substrate 40. The top surfaces 44b of the isolation regions 44 may be identified with major surface 24a of the isolation regions 24 shown in FIG. 1. The fins 42 are also located and extend between neighboring isolation regions 44. The isolation regions 44 may be recessed using an acceptable etching process, such as one that is selective to the material of the isolation regions 44. In other words, the etch process may consume or remove material of the isolation regions 44, while leaving material of the fins 42 substantially unperturbed. For example, a chemical oxide removal using a CERTAS® etch or an Applied Materials SICONI tool or dilute hydrofluoric (dHF) acid may be used to recess the isolation regions 44.

The process described with respect to FIGS. 2, 3A, 3B, 4A, and 4B is just one example of how the fins 42 and the isolation regions 44 may be formed. In other embodiments, a dielectric layer may be formed over a major surface of the substrate 40 shown in FIG. 2; trenches may be etched through the dielectric layer; epitaxial fins may be epitaxially grown in the trenches; and the dielectric layer may be recessed such that the homoepitaxial and/or heteroepitaxial structures protrude from the dielectric layer to form epitaxial fins. It may be advantageous to epitaxially grow a material or epitaxial fin structure for n-type finFETs different from the material or epitaxial fin structure for p-type finFETs.

Figure 5:
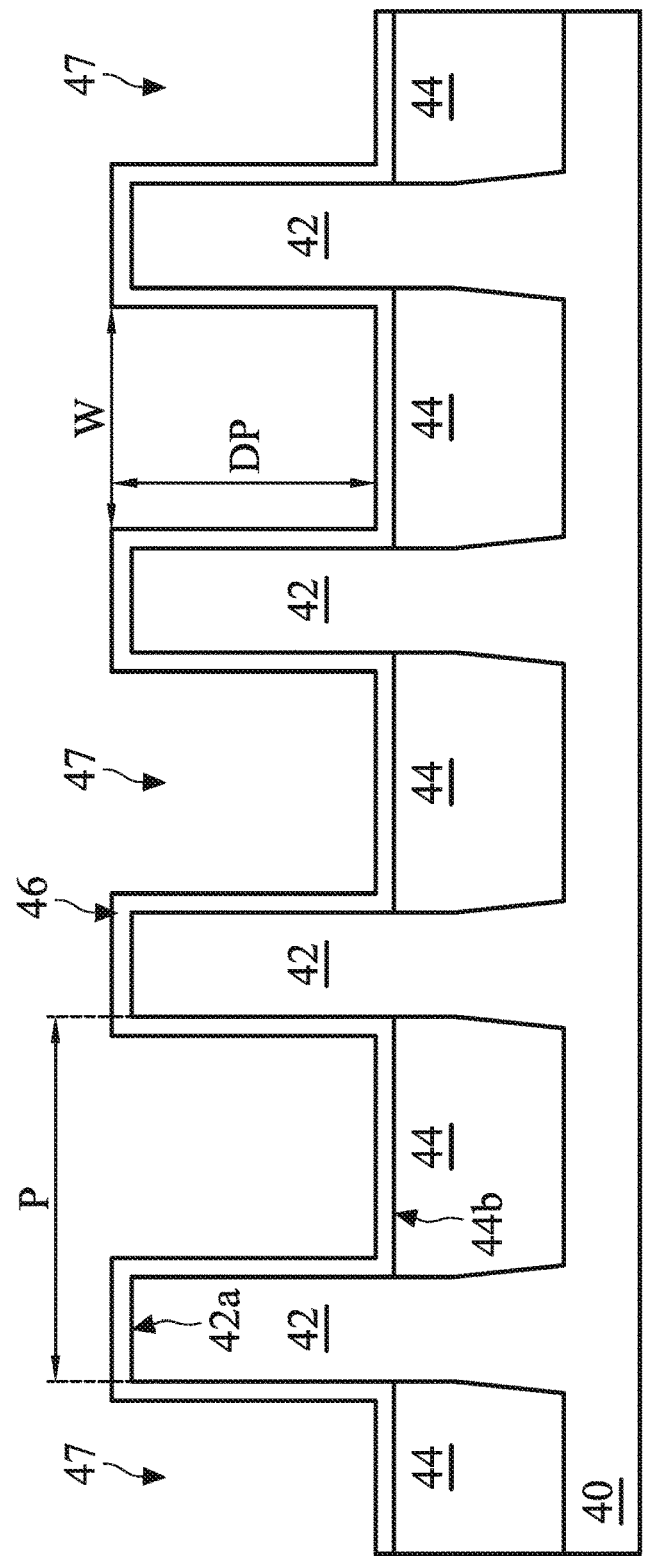

Referring to FIG. 5, a dummy dielectric layer 46 is formed (e.g. conformally formed) over the fins 42 and over isolation regions 44 (e.g. over top surfaces 44b of the isolation regions 44). The dummy dielectric layer 46 may be, for example, silicon oxide, silicon nitride, a combination thereof, or the like, and may be deposited or thermally grown according to acceptable techniques, such as CVD, thermal oxidation, or the like. As shown in FIG. 5, the formation of dummy dielectric layer 46 may define openings 47, each of which may be disposed between neighboring fins 42 (e.g. immediately adjacent fins 42). In some embodiments, an aspect ratio of an opening 47 may be defined as a ratio of a depth DP of the trench 47 to a width W of the opening 47. The aspect ratio of each opening 47 may be greater than or equal to about 5.

Figure 6:
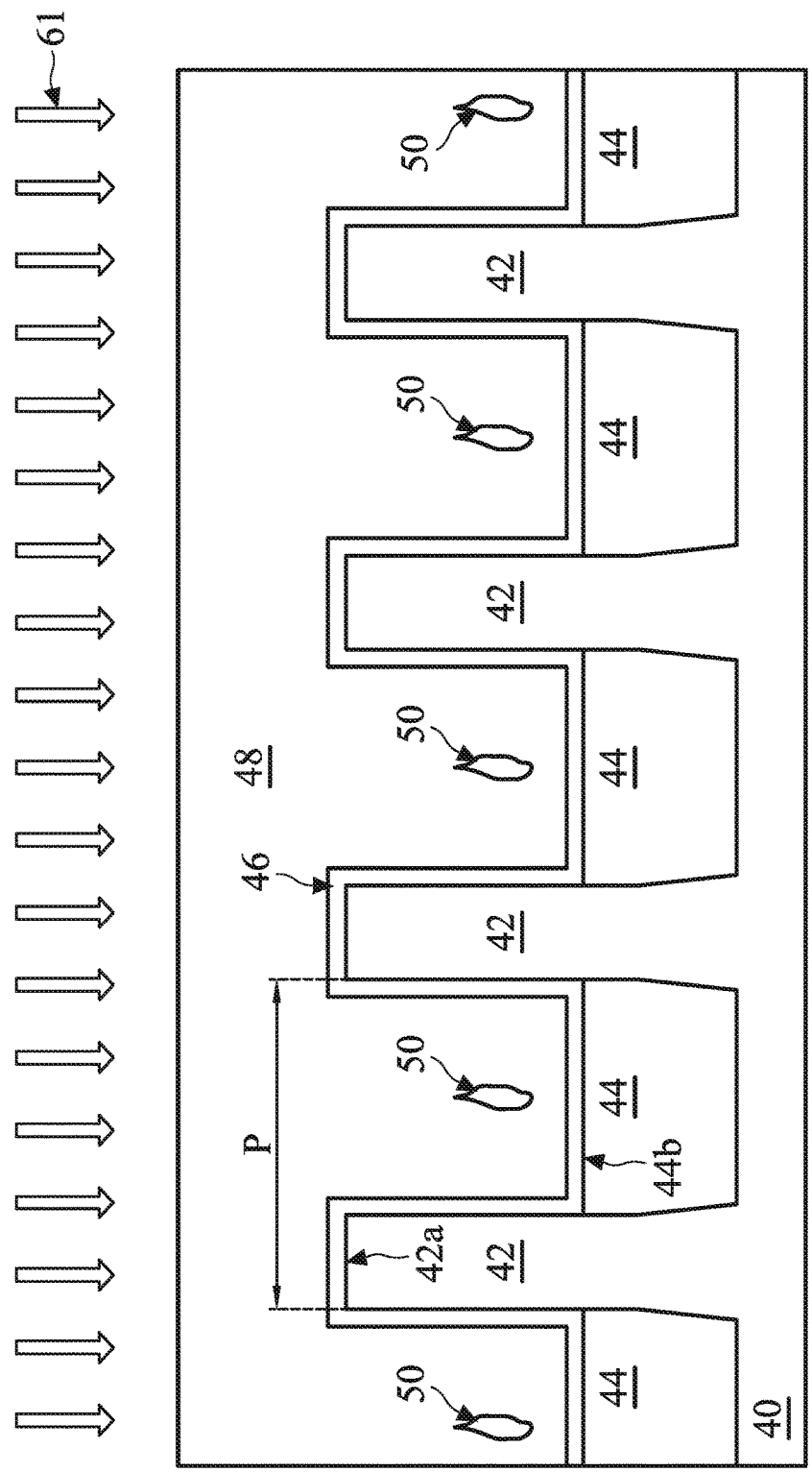

Referring to FIG. 6, a first dummy gate layer 48 is formed over the dummy dielectric layer 46 and between neighboring fins 42 using a process 61. In other words, openings 47 may be filled with material of first dummy gate layer 48. First dummy gate layer 48 may include a conductive material and may include at least one of polycrystalline-silicon (polysilicon), poly-crystalline silicon-germanium (poly-SiGe), metallic nitrides, metallic silicides, metallic oxides, and metals. First dummy gate layer 48 may include other materials that have a high etching selectivity from the etching of isolation regions 44. In one embodiment, amorphous silicon is deposited and recrystallized to create polysilicon. The process 61 may include a deposition process, such as by a physical vapor deposition (PVD), CVD, sputter deposition, or other techniques known in the art for depositing conductive materials. In some other examples, the process 61 may be an epitaxial process. In some embodiments, such as in the example of FIG. 6, first dummy gate layer 48 may be formed over the dummy dielectric layer 46 and then planarized, such as by a CMP process.

As described above, as semiconductor process technology advances beyond the sub-20 nm node, reduced feature size poses more challenges for semiconductor manufacturing. For example, referring to FIG. 6, the small pitch P between neighboring fins 42 (which may be less than or equal to about 10 nm) can result in the openings 47 located between neighboring fins 42 to have a high aspect ratio, thereby causing at least one first void 50 to form in first dummy gate layer 48 between neighboring fins 42. In other words, the process 61 for forming first dummy gate layer 48 (e.g. CVD process) may have poor gap-filling capabilities when the openings 47 have an aspect ratio greater than about 5, thereby causing at least one first void 50 to form in first dummy gate layer 48 and between some or all of the fins 42. The dimensions of the at least one first void 50 relative to each other and relative to the fins 42 are merely illustrative and not meant to be limiting. It is noted that the FCVD process described above with regards to the formation of isolation regions 44 may not be suitable for materials of first dummy gate layer 48.

Figure 7:
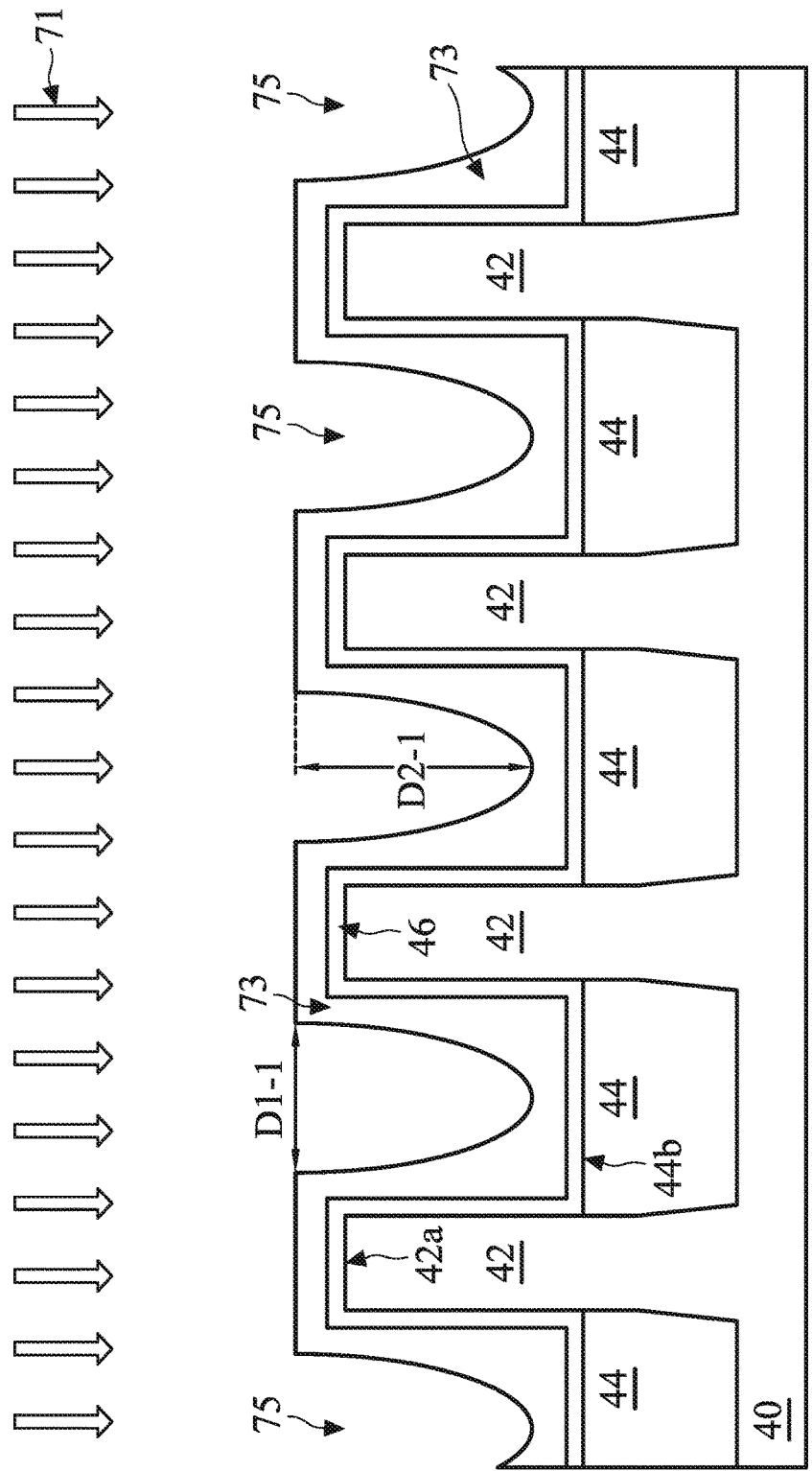

FIG. 7 shows a process 71 that etches first dummy gate layer 48 shown in FIG. 6. The process 71 may consume or remove material of first dummy gate layer 48. As depicted in the example of FIG. 7, process 71 is performed to expose the at least one first void 50 in first dummy gate layer 48. A result of process 71 is formation of a first dummy gate structure 73 that lines (e.g. coarsely lines) the dummy dielectric layer 46 and fins 42. The first dummy gate structure 73 may comprise similar materials as first dummy gate layer 48. Process 71 removes material of first dummy gate layer 48 disposed over and around the at least one first void 50, thereby creating a first tapered trench 75 between neighboring fins 42 (e.g. immediately adjacent fins 42). The first tapered trench 75 may have sidewalls defined by first dummy gate structure 73. As shown in the example of FIG. 7, first tapered trench 75 may have a first dimension D1-1 at an opening of first tapered trench 75. The first dimension D1-1 may be identified as the widest lateral extent (e.g. a width) of first tapered trench 75. Further shown in FIG. 7 is a second dimension D2-1 of first tapered trench 75, which may be identified as a depth of first tapered trench 75. An aspect ratio of first tapered trench 75 (which may be defined as a ratio of second dimension D2-1 to first dimension D1-1) may be smaller than the aspect ratio of opening 47 shown in FIG. 5. As an example, the aspect ratio of first tapered trench 75 may be between 1.5 times to about 3 times less than the aspect ratio of opening 47. Due to the smaller aspect ratio of first tapered trench 75 (e.g. compared to opening 47), a subsequent deposition process may be able to effectively fill first tapered trench 75 with material of first dummy gate layer 48, and consequently reduce or substantially eliminate the presence of voids in the dummy gate layer.

In some embodiments, process 71 may be an etch process that includes the use of a chlorine-containing precursor (e.g. a $Cl_2$ precursor). As an example, process 71 may be a plasma reactive ion etch (RIE) using chlorine or a wet polysilicon etch using chlorine-containing etch chemistry. In other embodiments, process 71 may include the use of other halogen-containing precursors. Process 71 may be an anisotropic etch process. The combination of process 61 in FIG. 6 and process 71 in FIG. 7 may be referred to as a deposition-etch step. Such a deposition-etch steps may be repeated, as described below in respect of FIGS. 8 and 9.

Figure 8:
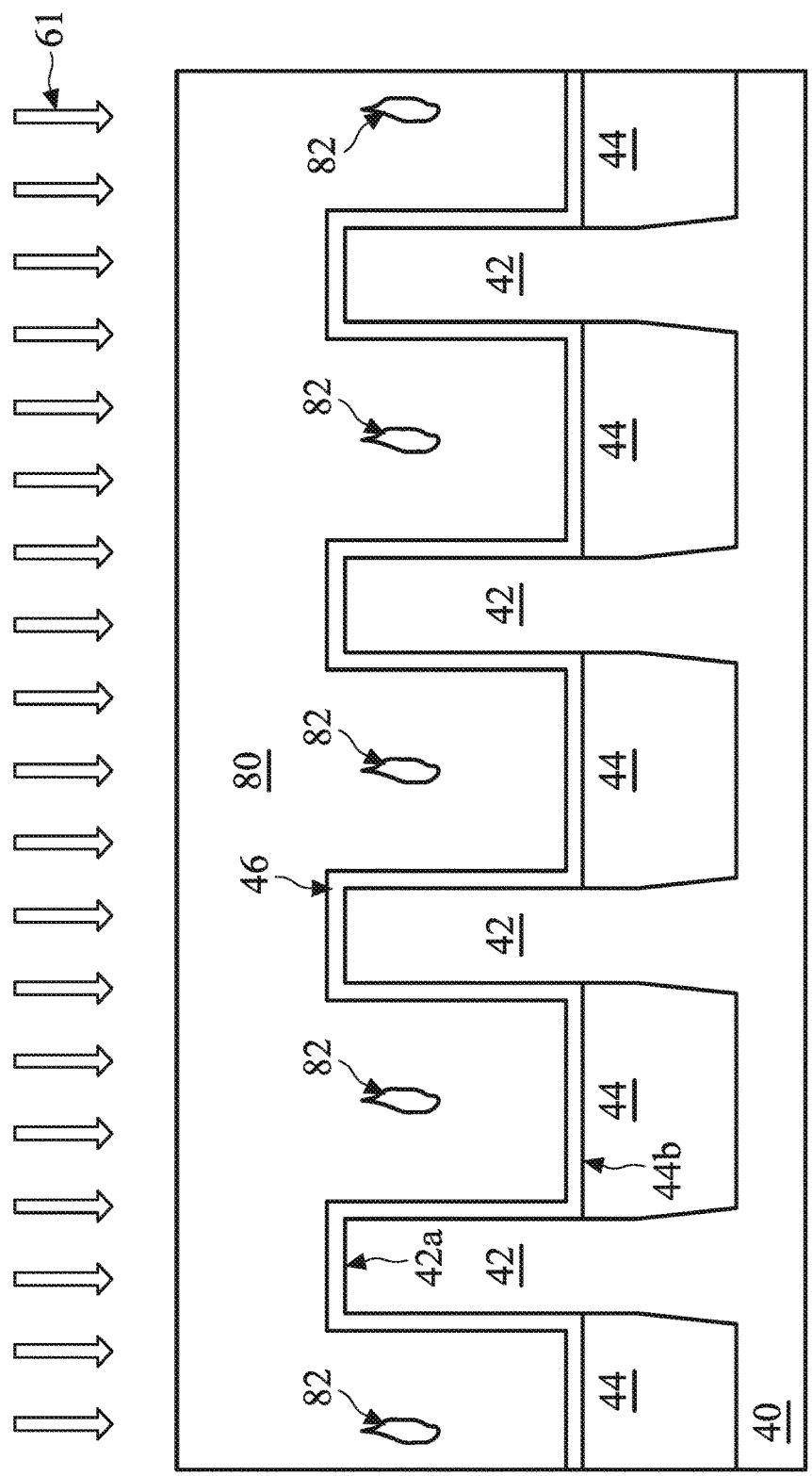

Referring to FIG. 8, process 61 is repeated in order to fill first tapered trench 75 with material of first dummy gate layer 48 (e.g. polysilicon). The aspect ratio of the first tapered trench 75 may be less than the aspect ratio of opening 47; however, process 61 may not be adapted to fill (e.g. completely fill) first tapered trench 75 such that voids are avoided. As such, the process 61 performed in FIG. 8 may yield second dummy gate layer 80 having at least one second void 82 formed between neighboring fins 42. In some embodiments, such as in the example of FIG. 8, second dummy gate layer 80 may be formed and then planarized, such as by a CMP process. In comparison to the at least one first void 50 in FIG. 6, the at least one second void 82 in FIG. 8 may be spaced farther from isolation regions 44. In other words, a bottom-most portion of the at least one second void 82 may be located farther from top surfaces 44b of the isolation regions 44 compared to a bottom-most portion of the at least one first void 50. The dimensions of the second voids 82 relative to each other and relative to the fins 42 are merely illustrative and not meant to be limiting.

Figure 9:
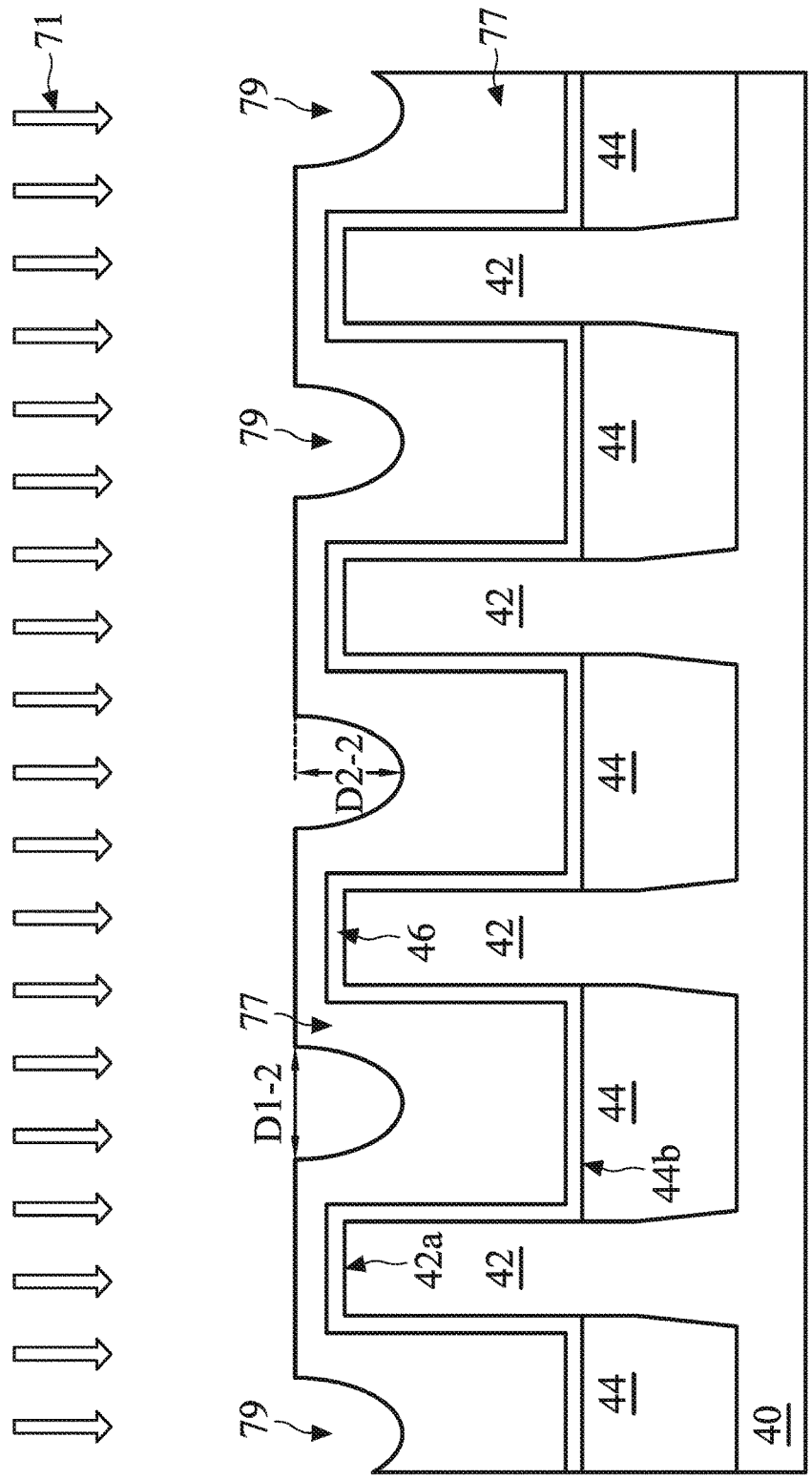

Referring to FIG. 9, process 71 (e.g. described above in respect of FIG. 7) is repeated. In particular, process 71 etches second dummy gate layer 80 shown in FIG. 8. The process 71 may consume or remove material of second dummy gate layer 80. As depicted in the example of FIG. 9, process 71 is performed to expose the at least one second void 82 in second dummy gate layer 80. A result of process 71 is formation of a second dummy gate structure 77 that lines (e.g. coarsely lines) the dummy dielectric layer 46 and fins 42. The second dummy gate structure 77 may comprise similar materials as first dummy gate layer 48. Process 71 removes material of second dummy gate layer 80 disposed over and around the at least one second void 82, thereby creating a second tapered trench 79 between neighboring fins 42 (e.g. immediately adjacent fins 42). The second tapered trench 79 may have sidewalls defined by second dummy gate structure 77. As shown in the example of FIG. 9, second tapered trench 79 may have a first dimension D1-2 at an opening of second tapered trench 79. The first dimension D1-2 may be identified as the widest lateral extent (e.g. a width) of second tapered trench 79. Further shown in FIG. 9 is a second dimension D2-2 of second tapered trench 79, which may be identified as a depth of second tapered trench 79. An aspect ratio of second tapered trench 79 (which may be defined as a ratio of second dimension D2-2 to first dimension D1-2) may be smaller than the aspect ratio of first tapered trench 75 shown in FIG. 7. As an example, the aspect ratio of second tapered trench 79 may be between 1.5 times to about 3 times less than the aspect ratio of first tapered trench 75. Due to the smaller aspect ratio of second tapered trench 79 (e.g. compared to first tapered trench 75), a subsequent deposition process may be able to effectively fill second tapered trench 79 with material of first dummy gate layer 48, and consequently reduce or substantially eliminate the presence of voids in the dummy gate layer.

Figure 10:
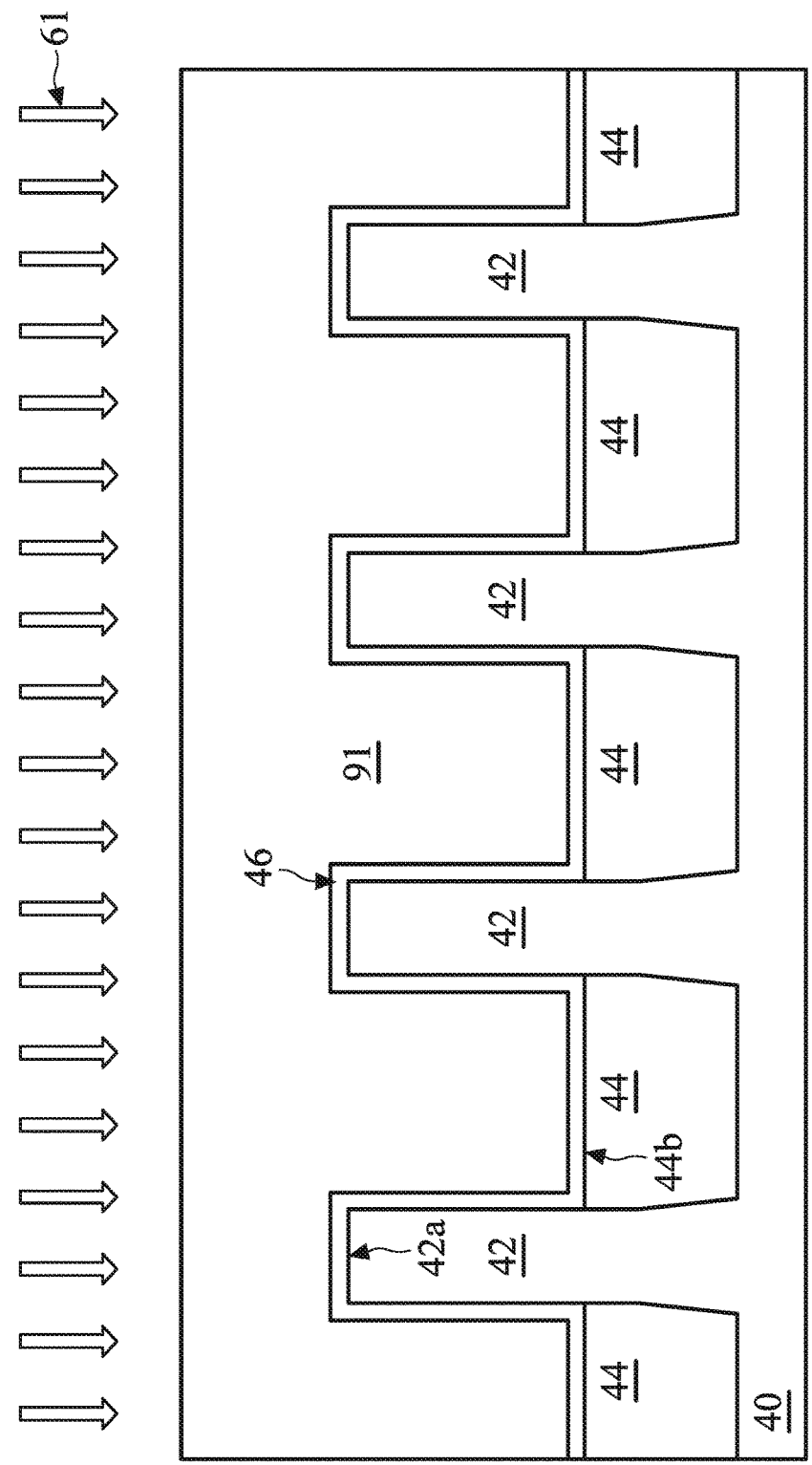

Referring to FIG. 10, process 61 is repeated in order to fill second tapered trench 79 with material of first dummy gate layer 48 (e.g. polysilicon) to form a sacrificial dummy gate layer 91 that may be substantially free from voids. The aspect ratio of the second tapered trench 79 may be less than the aspect ratio of first tapered trench 75 and the process 61 may be able to fill (e.g. completely fill) second tapered trench 79, as shown in FIG. 10. In some embodiments, such as in the example of FIG. 10, sacrificial dummy gate layer 91 may be formed and then planarized, such as by a CMP process. The number of deposition-etch steps needed to eventually form sacrificial dummy gate layer 91 that is substantially free from voids may depend, at least in part, on the pitch P between neighboring fins 42. For example, in an embodiment where pitch P is about 10 nm, two deposition-etch steps (e.g. the steps depicted in FIGS. 6, 7, 8, and 9) may be needed to eventually form sacrificial dummy gate layer 91. However, in an embodiment where pitch P is about 7 nm, three deposition-etch steps may be needed to eventually form sacrificial dummy gate layer 91 that is substantially free from voids.

Sacrificial dummy gate layer 91 may be removed in a replacement gate process. As an example, sacrificial dummy gate layer 91 may be removed (e.g. using in one or more etching steps) and replaced by, e.g., a metal gate. Stated differently, sacrificial dummy gate layer 91 may be removed and subsequently replaced by a gate-fill process (e.g. described below in respect of FIGS. 14 to 23). As semiconductor process technology advances beyond the sub-20 nm node, the above-described method of forming sacrificial dummy gate layer 91 may provide better gap-filling capabilities than conventional methods and to reduce or substantially eliminate voids formed in sacrificial dummy gate layer 91. Due to the reduction or substantial elimination of voids in sacrificial dummy gate layer 91, formation of residue (e.g. SiN residue) during or after removal of sacrificial dummy gate layer 91 may be reduced or avoided, thereby improving manufacturing yield. The above-described method of forming sacrificial dummy gate layer 91 may be applied to trenches located between neighboring fins 42 that have a high aspect ratio (e.g. greater than or equal to about 7). The above-described method of forming sacrificial dummy gate layer 91 may also be compatible with currently-available tools and processes such that new tool evaluation, calibration, and manufacture are avoided. Additionally, the above-described method avoids use of precursor gases that may include at least one of silane ($SiH_4$), disilane ($Si_2H_6$), and dichlorosilane ($SiH_2Cl_2$), thereby preventing an increase in the cost of manufacturing semiconductor devices having fins 42.

Figure 11:
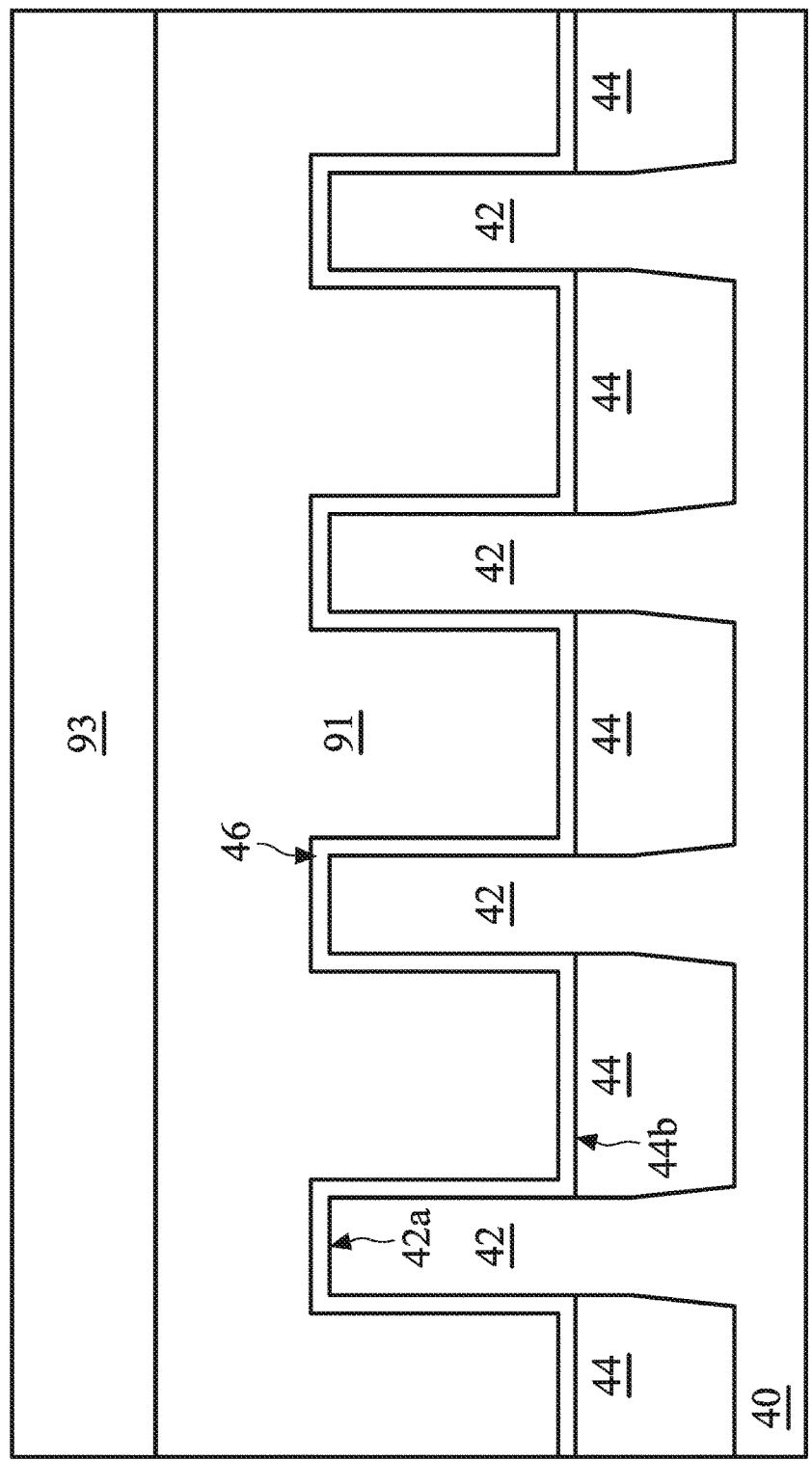

Referring to FIG. 11, a mask layer 93 is formed over sacrificial dummy gate layer 91. The mask layer 93 may include, for example, SiN, SiON, or the like. In this example, a single mask layer 93 is formed over each fin 42. In other embodiments, separate mask layers may be formed over the fins 42.

Figure 12A:
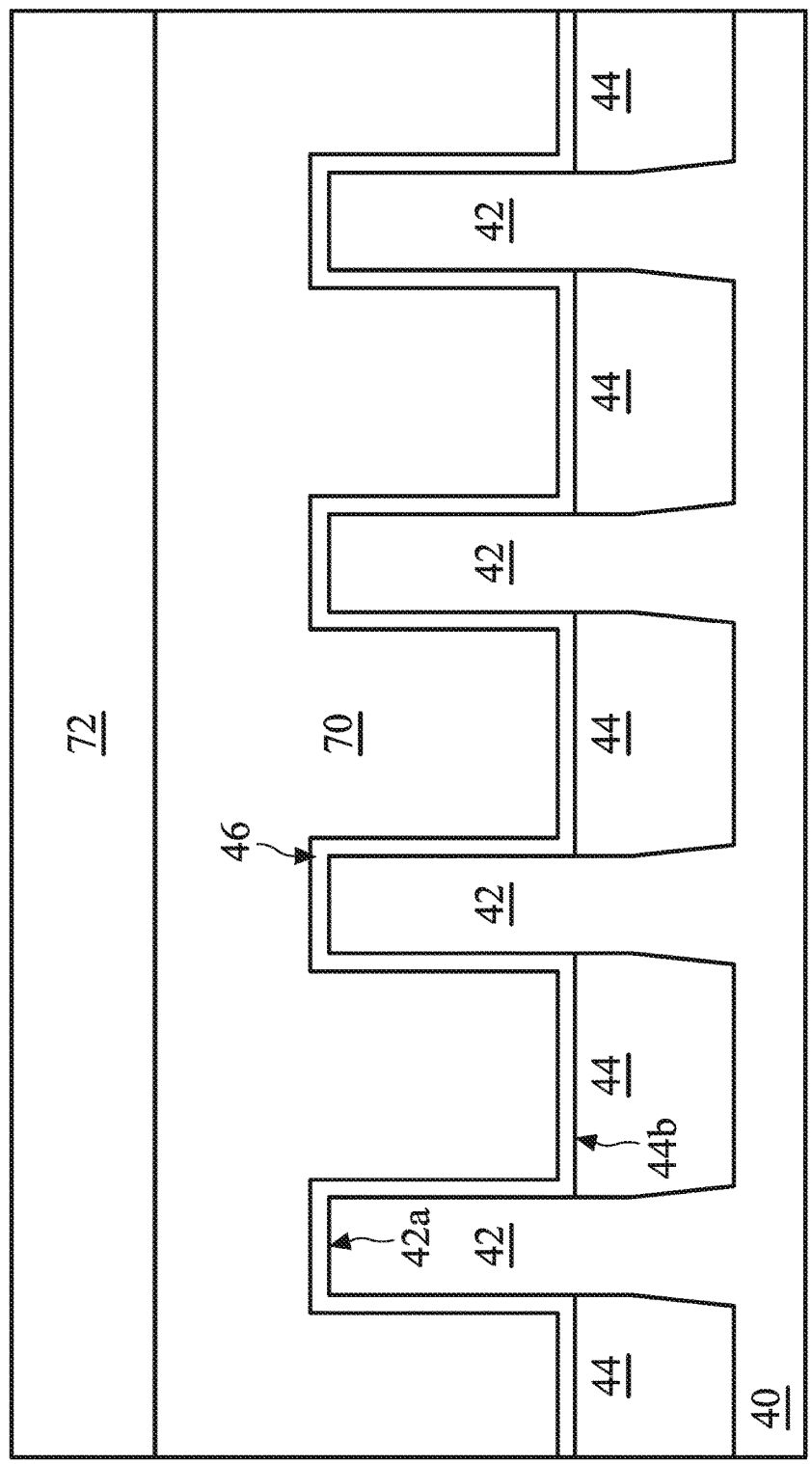
Figure 12B:
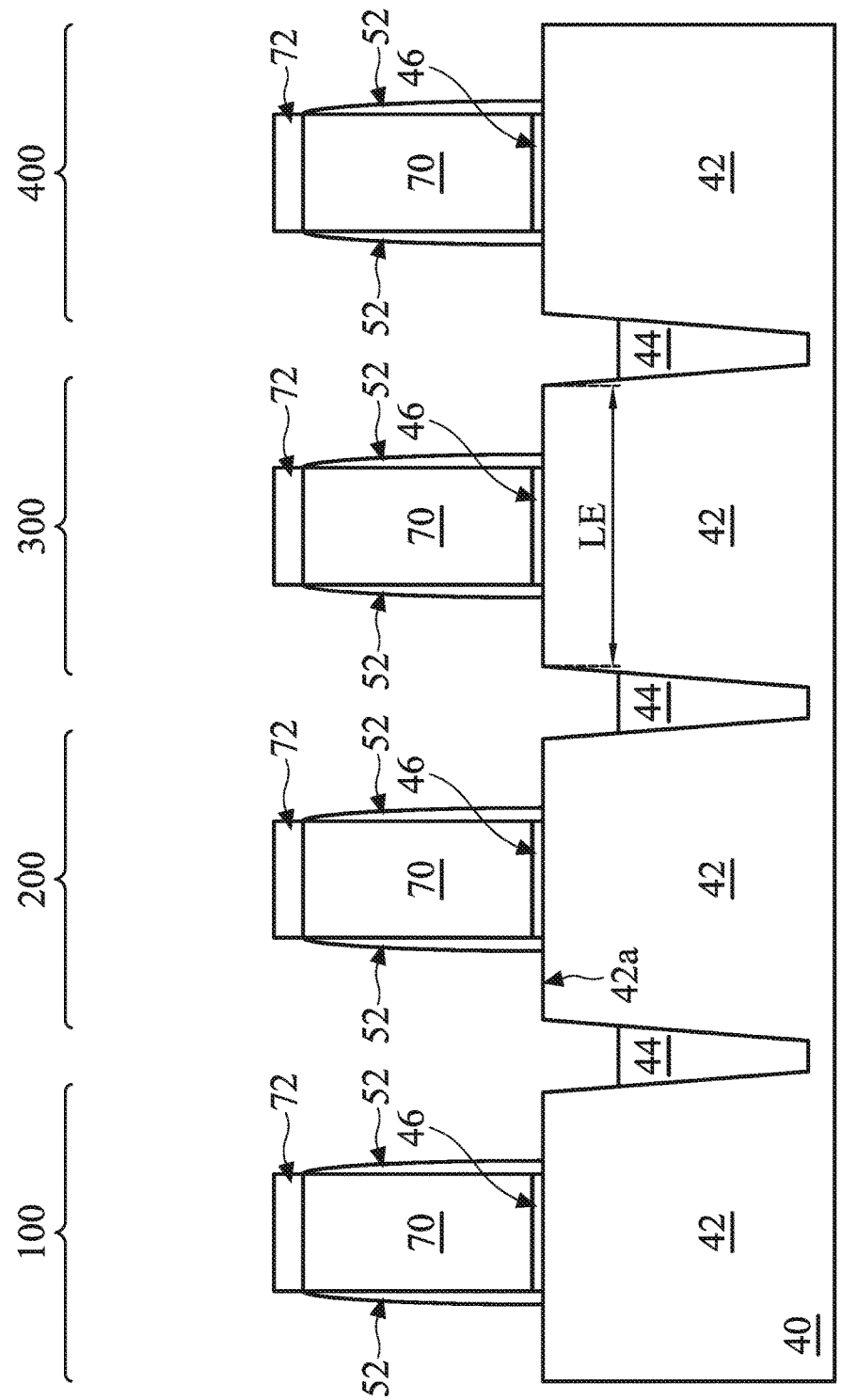

Referring to FIGS. 12A and 12B, the mask layer 93 may be patterned using acceptable photolithography and etching techniques to form masks 72. The pattern of the masks 72 then may be transferred to the sacrificial dummy gate layer 91 and dummy dielectric layer 46 by an acceptable etching technique to form dummy gates 70. The dummy gates 70 cover respective channel regions of the fins 42. Also shown in FIG. 12B are gate spacers 52 that line sidewalls of the dummy gates 70 may be formed over the fins 42 (e.g. over a portion of the longitudinal extent LE of each fin 42). The gate spacers 52 may be formed by depositing (e.g. conformally depositing), such as by CVD or the like, a material and subsequently anisotropically etching the material. The material of the gate spacers 52 may be silicon nitride, silicon carbon nitride, a combination thereof, or the like.

Although not specifically illustrated, implants for lightly doped source/drain (LDD) regions may be performed. Similar to the implants discussed above in respect of FIGS. 3A and 3B, a mask, such as a photoresist, may be formed over the third region 300 and the fourth region 400 while exposing the first region 100 and the second region 200, and n-type impurities may be implanted into the exposed fins 42 in the first region 100 and the second region 200. The mask may then be removed. Subsequently, a mask, such as a photoresist, may be formed over the first region 100 and the second region 200 while exposing the third region 300 and the fourth region 400, and p-type impurities may be implanted into the exposed fins 42 in the third region 300 and the fourth region 400. The mask may then be removed. The n-type impurities may be any of, or any combination of, the n-type impurities previously discussed, and the p-type impurities may be any of, or any combination of, the p-type impurities previously discussed. The lightly doped source/drain regions may have a concentration of impurities from about $10^{15}$ $cm^{-3}$ to about $10^{16}$ $cm^{-3}$. An anneal may be used to activate the implanted impurities.

Figure 13:
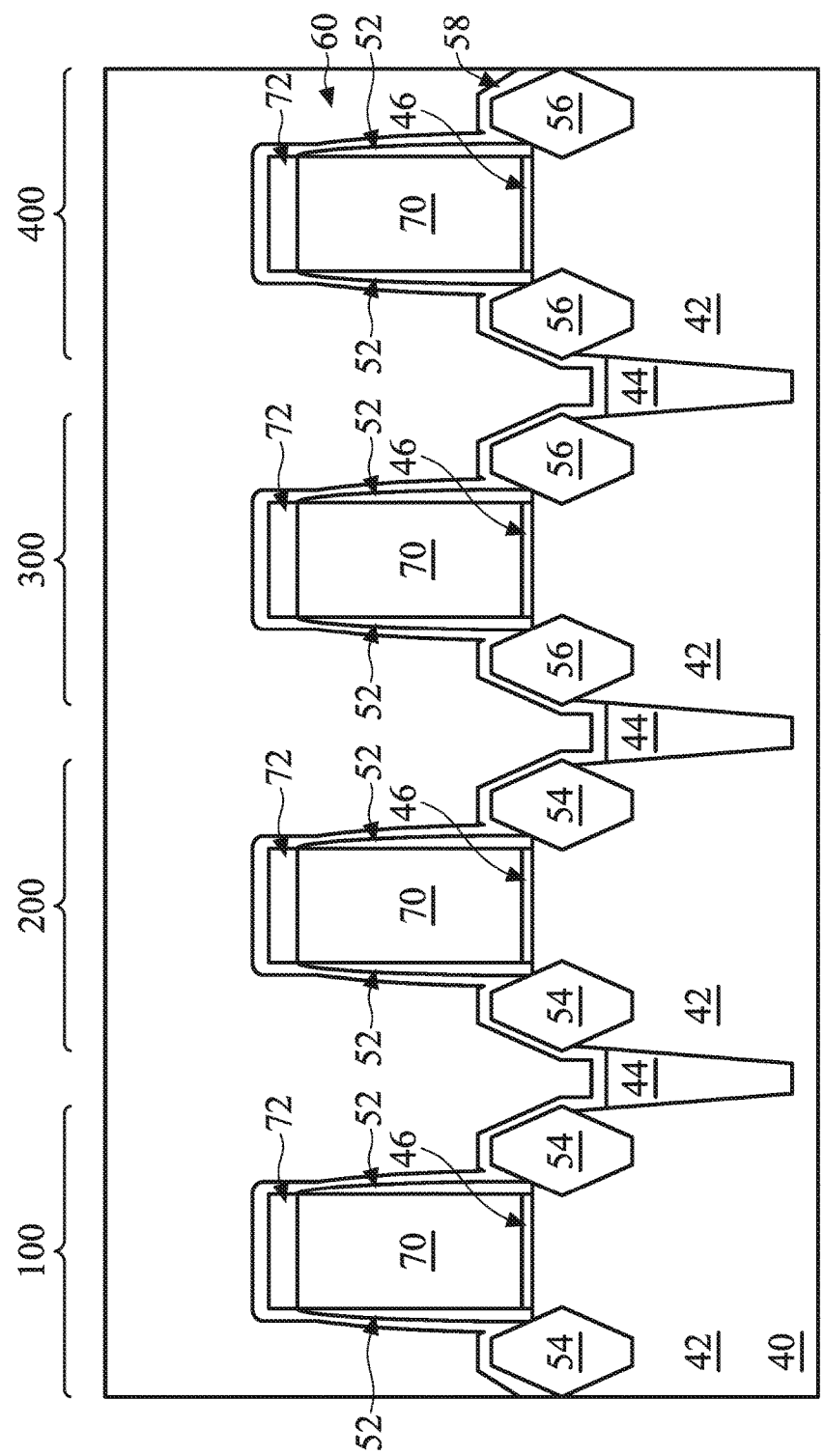

Referring to FIG. 13, epitaxial source/drain regions 54 and 56 may be formed in the source/drain region of the fins 42. In the first region 100 and the second region 200, epitaxial source/drain regions 54 are formed in the source/drain regions of the fins 42 such that each dummy gate 70 of a respective fin 42 is disposed between ones of a respective pair of the epitaxial source/drain regions 54. In the third region 300 and the fourth region 400, epitaxial source/drain regions 56 are formed in the source/drain regions of the fins 42 such that each dummy gate 70 of a respective fin 42 is disposed between ones of a respective pair of the epitaxial source/drain regions 54.

The epitaxial source/drain regions 54 in the first region 100 and the second region 200 (which may be used for n-type devices) may be formed by masking, such as with a hard mask, the third region 300 and the fourth region 400. Then, source/drain regions of the fins 42 in the first region 100 and the second region 200 are etched to form recesses. The etch may be any appropriate etch selective to the fins 42 and may be anisotropic. The epitaxial source/drain regions 54 in the first region 100 and the second region 200 are then epitaxially grown in the recesses. The epitaxial growth may be by using Metal-Organic CVD (MOCVD), Molecular Beam Epitaxy (MBE), Liquid Phase Epitaxy (LPE), Vapor Phase Epitaxy (VPE), the like, or a combination thereof. The epitaxial source/drain regions 54 may include any acceptable material, such as appropriate for n-type finFETs. For example, the epitaxial source/drain regions 54 may include silicon, SiC, SiCP, SiP, or the like. The epitaxial source/drain regions 54 may have surfaces raised from respective outer surfaces of the fins 42 and may have facets. The mask may then be removed, such as by using an etch process that is selective to the material of the mask.

The epitaxial source/drain regions 56 in the third region 300 and the fourth region 400 (which may be used for p-type devices) may be formed by masking, such as with a hard mask, the first region 100 and the second region 200. Then, source/drain regions of the fins 42 in the third region 300 and the fourth region 400 are etched to form recesses. The etch may be any appropriate etch selective to the fins 42 and may be anisotropic. The epitaxial source/drain regions 56 in the third region 300 and the fourth region 400 are then epitaxially grown in the recesses. The epitaxial growth may be by using MOCVD, MBE, LPE, VPE, the like, or a combination thereof. The epitaxial source/drain regions 56 may include any acceptable material, such as appropriate for p-type finFETs. For example, the epitaxial source/drain regions 56 may include SiGe, SiGeB, Ge, GeSn, or the like. The epitaxial source/drain regions 56 may have surfaces raised from respective outer surfaces of the fins 42 and may have facets. The mask may then be removed, such as by using an etch process that is selective to the material of the mask.

The epitaxial source/drain regions 54 and 56 may be implanted with dopants, similar to the process previously discussed in respect of FIGS. 3A and 3B. The epitaxial source/drain regions 54 and 56 may have an impurity concentration of between about $10^{19}$ cm$^{-3}$ and about $10^{21}$ cm$^{-3}$. The n-type impurities for source/drain regions in the first region 100 and the second region 200 (e.g. for n-type devices) may be any of the n-type impurities previously discussed, and the p-type impurities for source/drain regions in the third region 300 and the fourth region 400 (e.g. for p-type devices) may be any of the p-type impurities previously discussed. In other embodiments, the epitaxial source/drain regions 54 and 56 may be in-situ doped during growth.

Further in FIG. 13, an etch stop layer (ESL) 58 is formed on epitaxial source/drain regions 54 and 56, gate spacers 52, masks 72, and isolation regions 44. In some embodiments, the ESL 58 may include silicon nitride, silicon carbonitride, or the like, formed using Atomic Layer Deposition (ALD), chemical vapor deposition (CVD), the like, or a combination thereof. A bottom inter-layer dielectric (ILD0) 60 is deposited over the ESL 58. ILD0 60 may be a dielectric layer closest to fins 42 and may include Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, plasma-enhanced CVD (PECVD), FCVD, the like, or a combination thereof.

Figure 14:
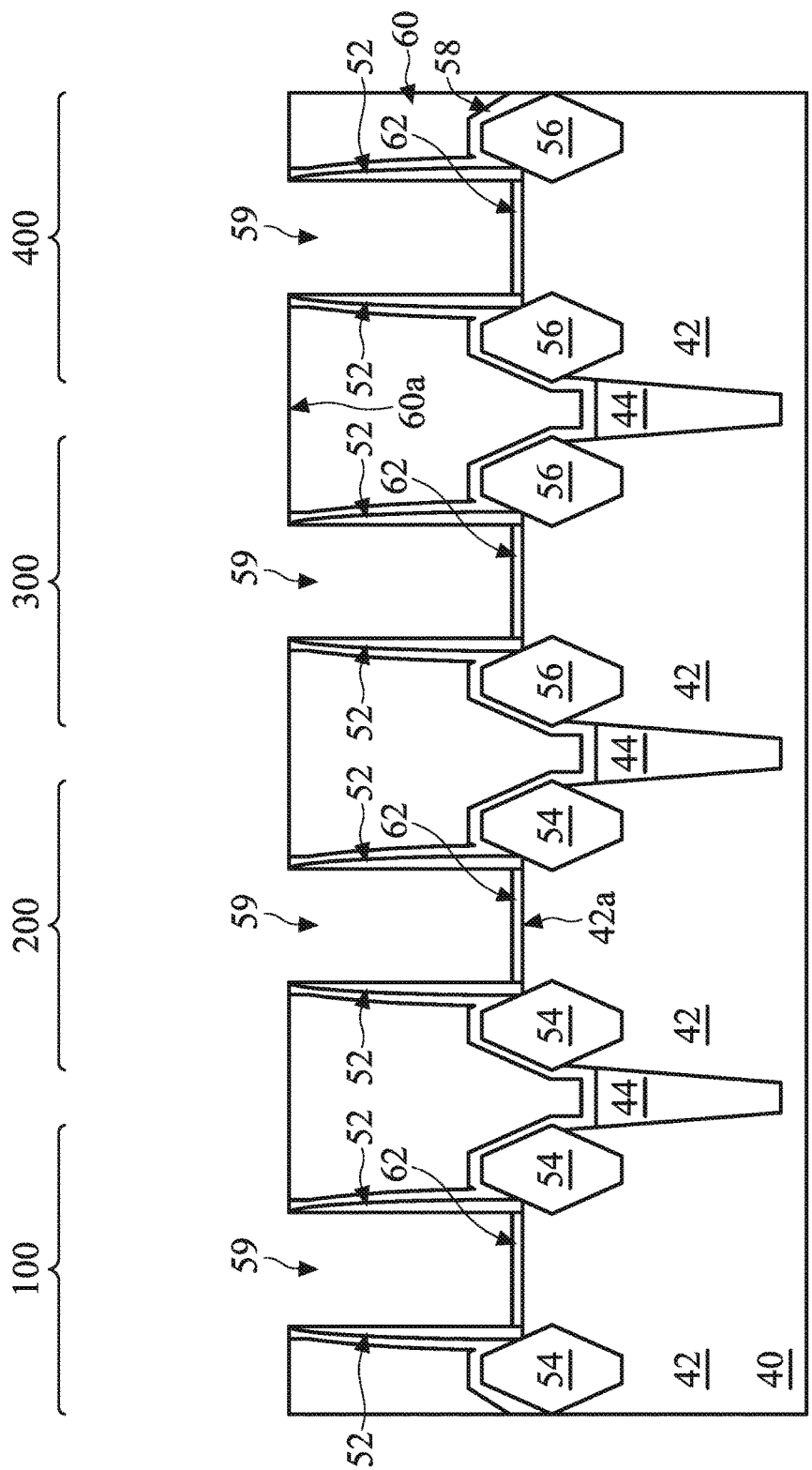

Referring to FIG. 14, a planarization process, such as a CMP, is performed to level a top surface 60a of ILD0 60 with the top surfaces of the dummy gates 70. The top surface 60a of ILD0 may be a major surface farthest from and directed away from the substrate 40. The CMP may also remove the masks 72 and the ESL 58 from over the dummy gates 70. Accordingly, top surfaces of the dummy gates 70 are exposed through the ILD0 60. The dummy gates 70 and the dummy dielectric layer 46 are removed in one or more etching steps, so that recesses 59 through the ILD0 60 and defined by the gate spacers 52 (e.g. inner sidewalls of the gate spacers 52) and the top surfaces 42a of the fins 42 are formed. Each recess 59 exposes a channel region of a respective fin 42. Each channel region is disposed between neighboring pairs of epitaxial source/drain regions 54 and 56 of a respective fin 42. The one or more etching steps may be selective to the materials of the dummy gates 70 and the dummy dielectric layer 46, and may be a dry or wet etching. During the etching, the dummy dielectric layer 46 may be used as an etch stop layer when the dummy gates 70 are etched. The dummy dielectric layer 46 may then be etched after the removal of the dummy gates 70. Although not specifically illustrated, depending on the similarity of materials used for the ILD0 60 and the dummy dielectric layer 46, the ILD0 60 may be recessed or etched back when the dummy dielectric layer 46 is removed, and this recessing may cause portions of at least one of the ESL 58 or the gate spacers 52 to protrude above the top surface 60a of the ILD0 60. Also shown in FIG. 14 is an interfacial dielectric 62 is formed in each recess 59 and on the top surfaces 42a of the fins 42 (e.g. after removal of dummy dielectric layer 46). The interfacial dielectric 62 may be, for example, an oxide or the like formed by thermal oxidation or the like. A thickness of the interfacial dielectric 62 may be in a range from about 10 Å to about 100 Å, such as about 40 Å.

Figure 15:
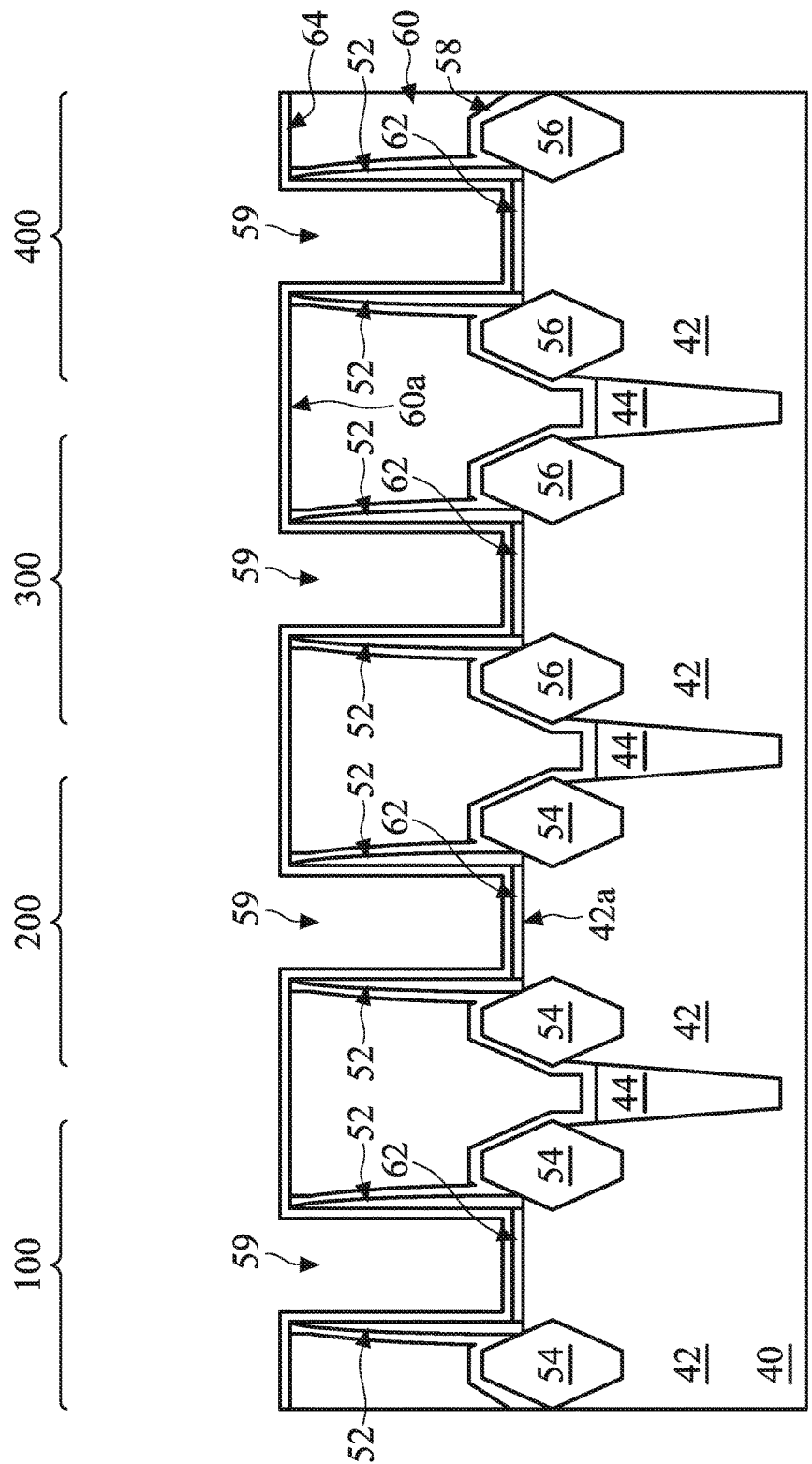

Referring to FIG. 15, a gate dielectric layer 64 is then formed on the top surface of the ILD0 60 and in the recesses 59 along sidewalls (e.g. inner sidewalls) of the gate spacers 52 and over the interfacial dielectric 62. In some embodiments, the gate dielectric layer 64 includes a high-k dielectric material, and in these embodiments, the gate dielectric layer 64 may have a k value greater than about 7.0, and may include a metal oxide or a silicate of Hf, Al, Zr, La, Mg, Ba, Ti, Pb, and combinations thereof. The gate dielectric layer 64 may be formed using ALD, CVD, Molecular-Beam Deposition (MBD), the like, or a combination thereof. A thickness of the gate dielectric layer 64 may be in a range from about 10 Å to about 100 Å, such as about 30 Å.

Figure 16:
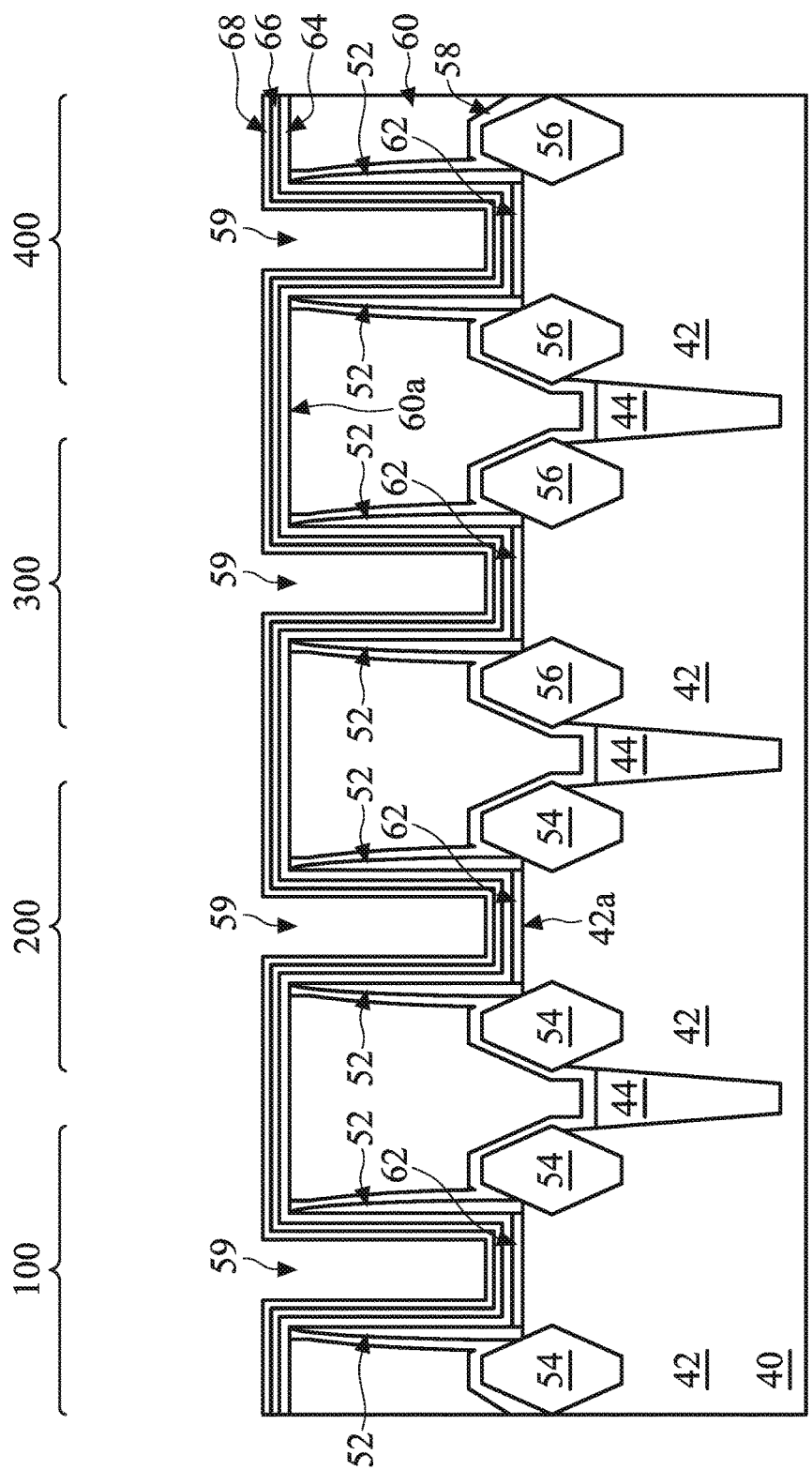

Referring to FIG. 16, a capping layer is then formed on the gate dielectric layer 64. In the illustrated embodiment, the capping layer includes a first sub-layer 66 and a second sub-layer 68. In other embodiments, however, the capping layer may be a single layer or may include additional sub-layers. The capping layer may function as a barrier layer to prevent a subsequently deposited metal-containing material from diffusing into the gate dielectric layer 64 or ILD0 60. Further, the second sub-layer 68, as illustrated, may function as an etch stop during the formation of work function tuning layers (also referred to as "work function metal layers") in various regions 100, 200, 300 and 400 if the first sub-layer 66 is formed from a same material as the work function tuning layers, as will become clearer in the description that follows.

The first sub-layer 66 may include titanium nitride (TiN) or the like deposited on the gate dielectric layer 64 by ALD, CVD, or the like. The second sub-layer 68 may include tantalum nitride (TaN) or the like deposited on the first sub-layer 66 by ALD, CVD, or the like. A thickness of the capping layer may be in a range from about 5 Å to about 50 Å, such as about 10 Å. In the illustrated embodiment, a thickness of the first sub-layer 66 may be in a range from about 5 Å to about 50 Å, such as about 20 Å, while a thickness of the second sub-layer 68 may be in a range from about 5 Å to about 50 Å, such as about 20 Å. In the example shown in FIG. 16, recesses 59 through the ILD0 60 and defined by the capping layer (e.g. the second sub-layer 68) are formed over each fin 42 as a result of forming the interfacial dielectric 62, the gate dielectric layer 64, and the capping layer (e.g. first sub-layer 66 and second sub-layer 68).

Figure 17:
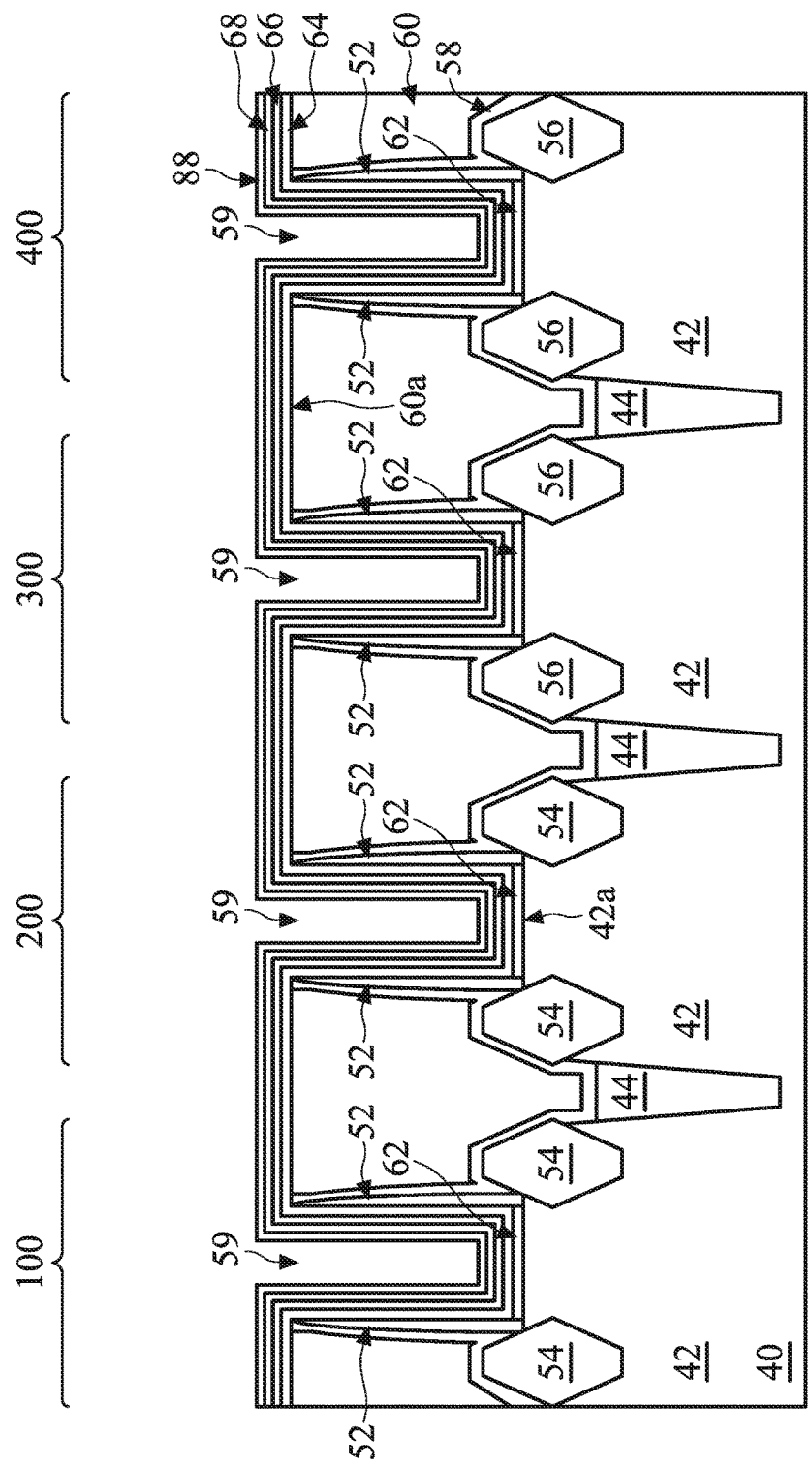

Referring to FIG. 17, a work function tuning layer 88 is formed on the capping layer (e.g. on the second sub-layer 68). The work function tuning layer 88 may line the recesses 59 (e.g. sidewalls and bottom surface of the recesses 59) and may also be formed over portions of the second sub-layer 68 disposed outside the recesses 59. The work function tuning layer 88 may be any acceptable material to tune a work function of a device to a desired amount given the application of the device to be formed, and may be deposited using any acceptable deposition process. In some embodiments, the work function tuning layer 88 includes titanium (Ti), titanium aluminum (TiAl), tantalum carbide (TaC), titanium aluminum nitride (TiAlN), tantalum carbo-nitride (TaCN), tantalum silicon nitride (TaSiN), or the like deposited by ALD, CVD, or the like. A thickness of the work function tuning layer 88 may be in a range from about 10 Å to about 100 Å, such as about 30 Å.

Figure 18:
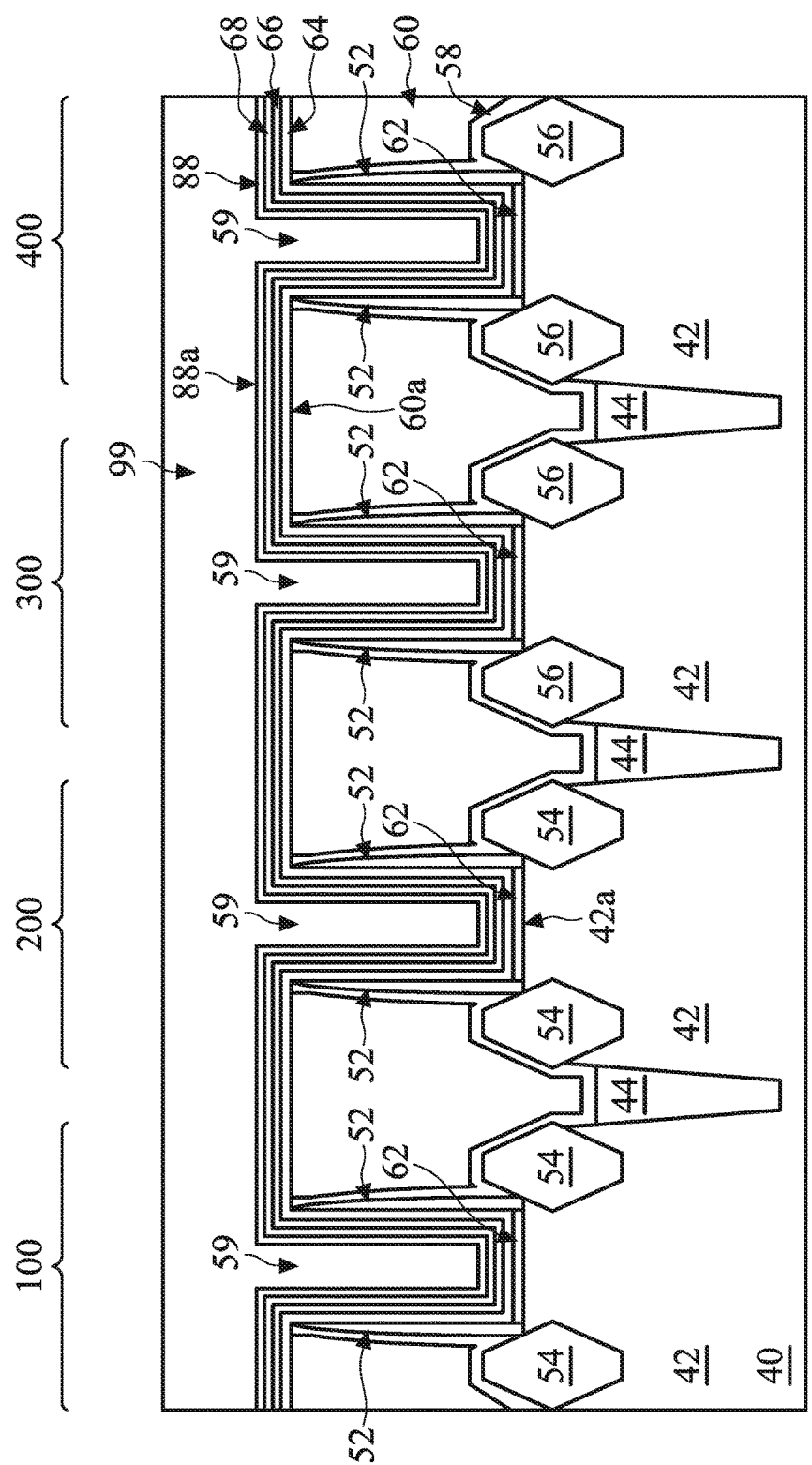

Referring to FIG. 18, a mask 99 is formed over the work function tuning layer 88. In some embodiments, such as in the example shown in FIG. 18, the mask 99 fills the recesses 59 and is also formed over portions of the work function tuning layer 88 disposed outside the recesses 59. As an example, the mask 99 is formed over a surface 88a of the work function tuning layer 88 directed away from the substrate 40. In some embodiments, the mask 99 may be a bottom anti-reflection coating (BARC). In such embodiments, the BARC may include silicon oxide, silicon oxynitride, or the like, and may be deposited by ALD, CVD, or the like. In other embodiments, the mask 99 is a photoresist, which may be formed by using a spin-on technique.

Figure 19:
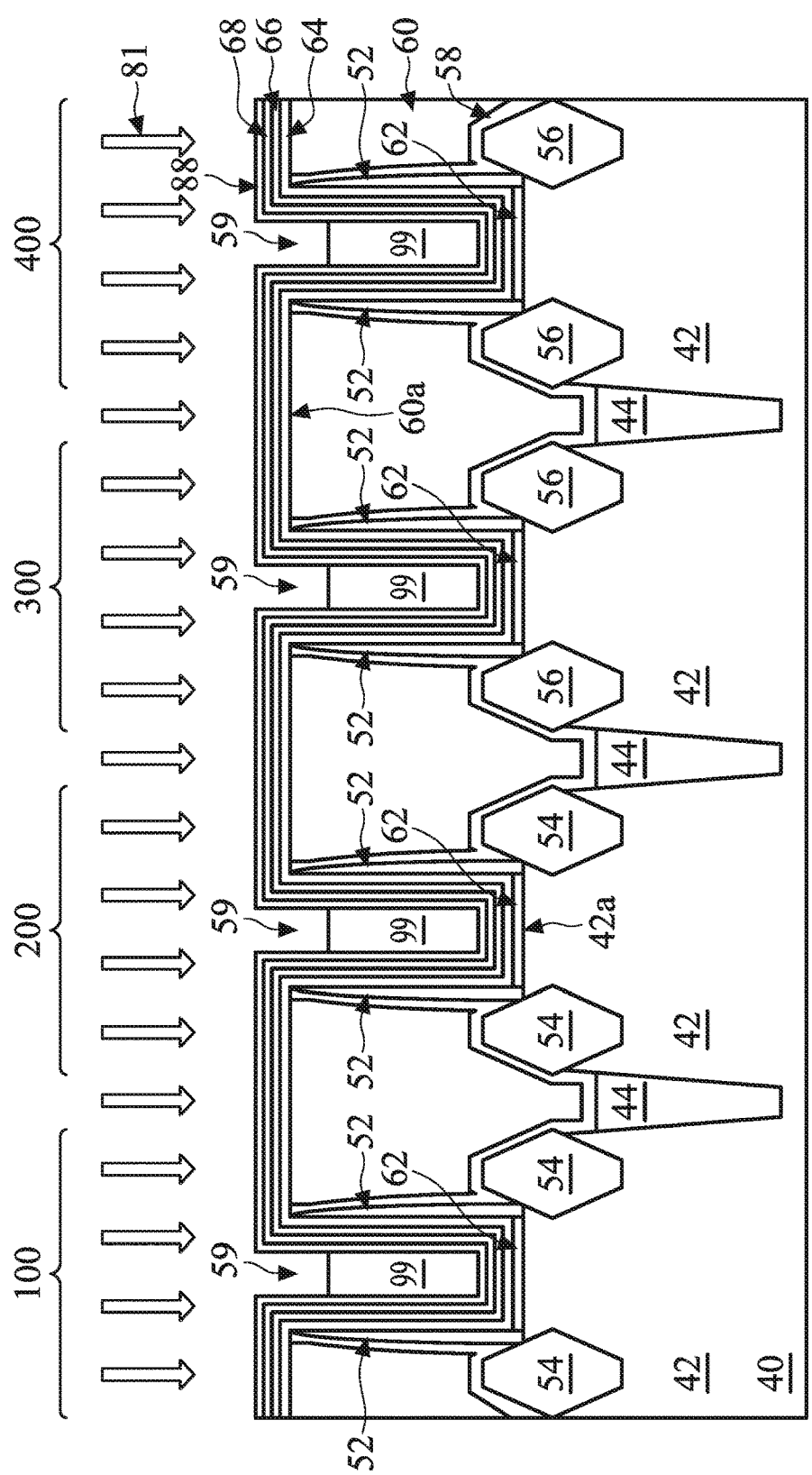

Referring to FIG. 19, the mask 99 may be recessed into the recesses 59 lined with the work function tuning layer 88. This may be accomplished using a process 81 that is selective to the mask 99. In other words, the process 81 consumes or removes material of the mask 99, while leaving material of the work function tuning layer 88 unconsumed or substantially unperturbed. As a result of recessing the mask 99, the recesses 59 are partially filled with the mask 99. In the embodiment where the mask 99 is a BARC, the process 81 may be at least one of an isotropic or a wet etch process. In such embodiments, the mask 99 is etched backed, and the extent to which the mask 99 is etched may be controlled by process knobs that tune the rate at which the mask 99 is consumed by etch back process 81. In the embodiment where the mask 99 is a photoresist, the process 81 may be an ashing processing.

Figure 20:
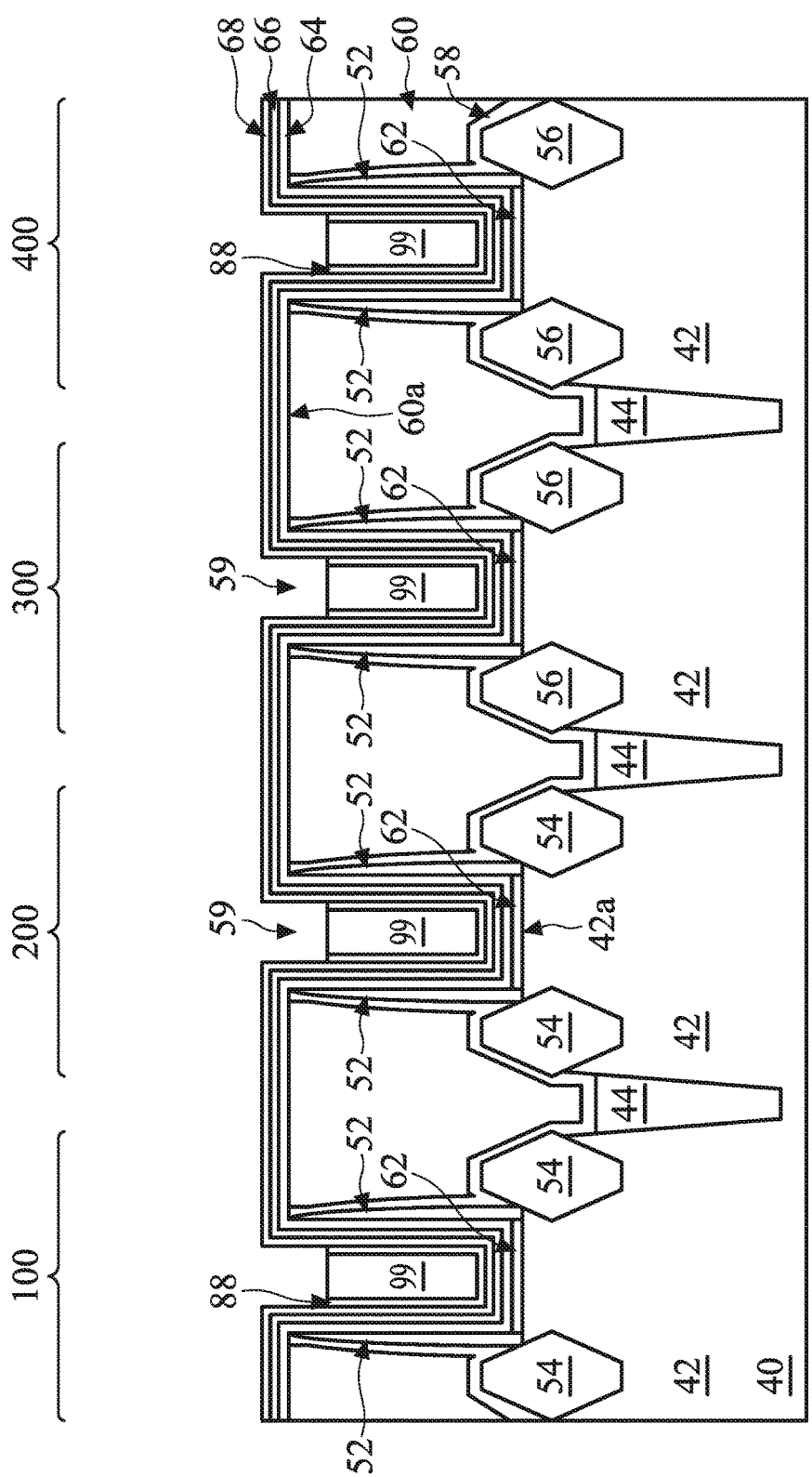

Referring to FIG. 20, an etch selective to the work function tuning layer 88 is performed to remove exposed portions of the work function tuning layer 88. In other words, the etch removes or consumes material of the work function tuning layer 88, while leaving material of the capping layer (e.g. second sub-layer 68) substantially unconsumed or unperturbed. As such, the capping layer (e.g. the second sub-layer 68) may act as an etch stop during the etch.

Figure 21:
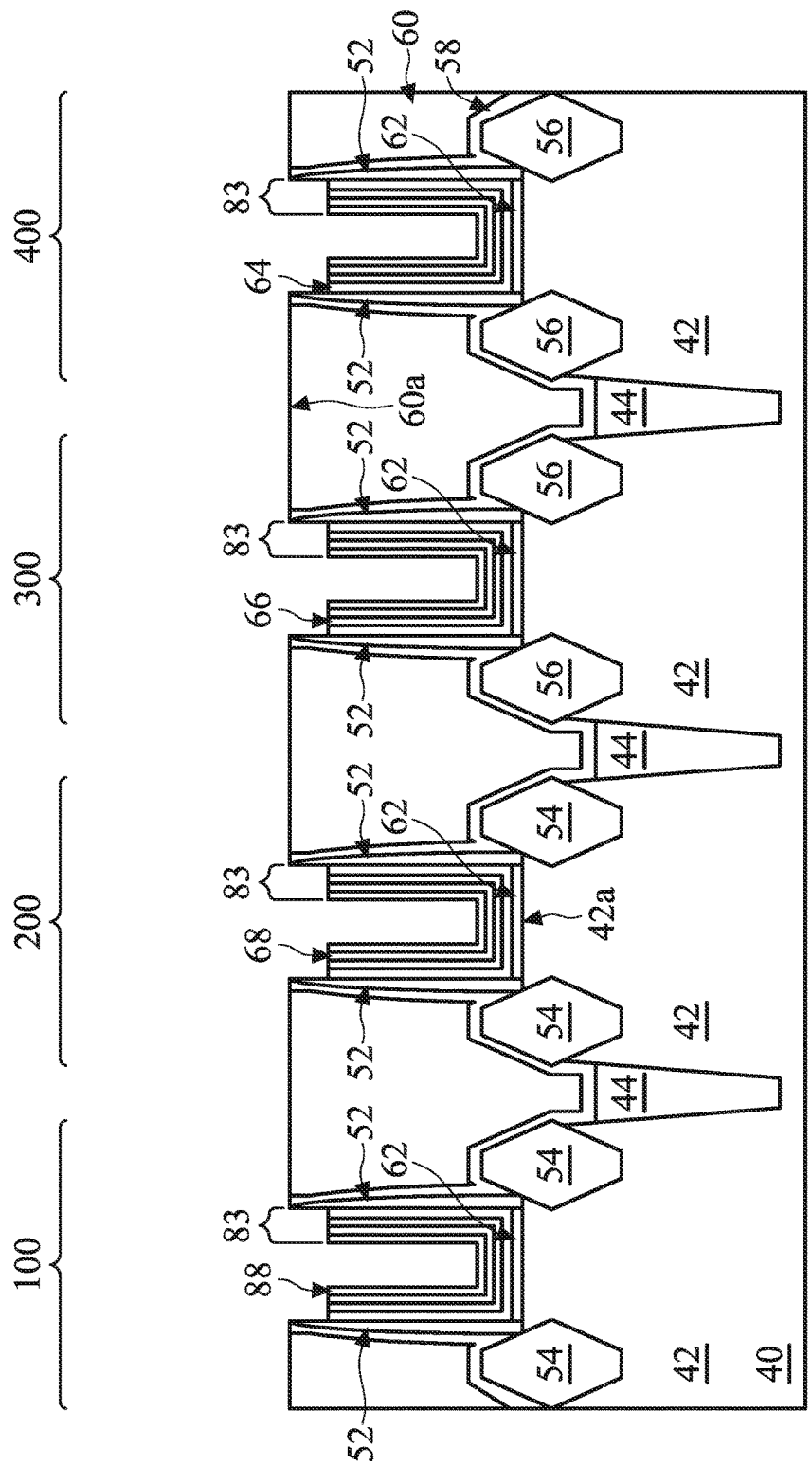

Referring to FIG. 21, exposed portions of the gate dielectric layer 64 and capping layer (including first sub-layer 66 and second sub-layer 68) are etched (e.g. using mask 99 as a mask). As a result, layered structures 83 are formed in the first, second, third, and fourth regions 100, 200, 300, and 400. The etch may be, for example, a dry or wet etch that may be selective to the materials of the gate dielectric layer 64 and capping layer (e.g. first sub-layer 66 and second sub-layer 68). Process parameters may be tuned to achieve the structure in FIG. 21. Following removal of exposed portions of the gate dielectric layer 64 and capping layer (e.g. first sub-layer 66 and second sub-layer 68), the mask 99 is removed using a process similar to the process 81 described above in respect of FIG. 19.

Figure 22:
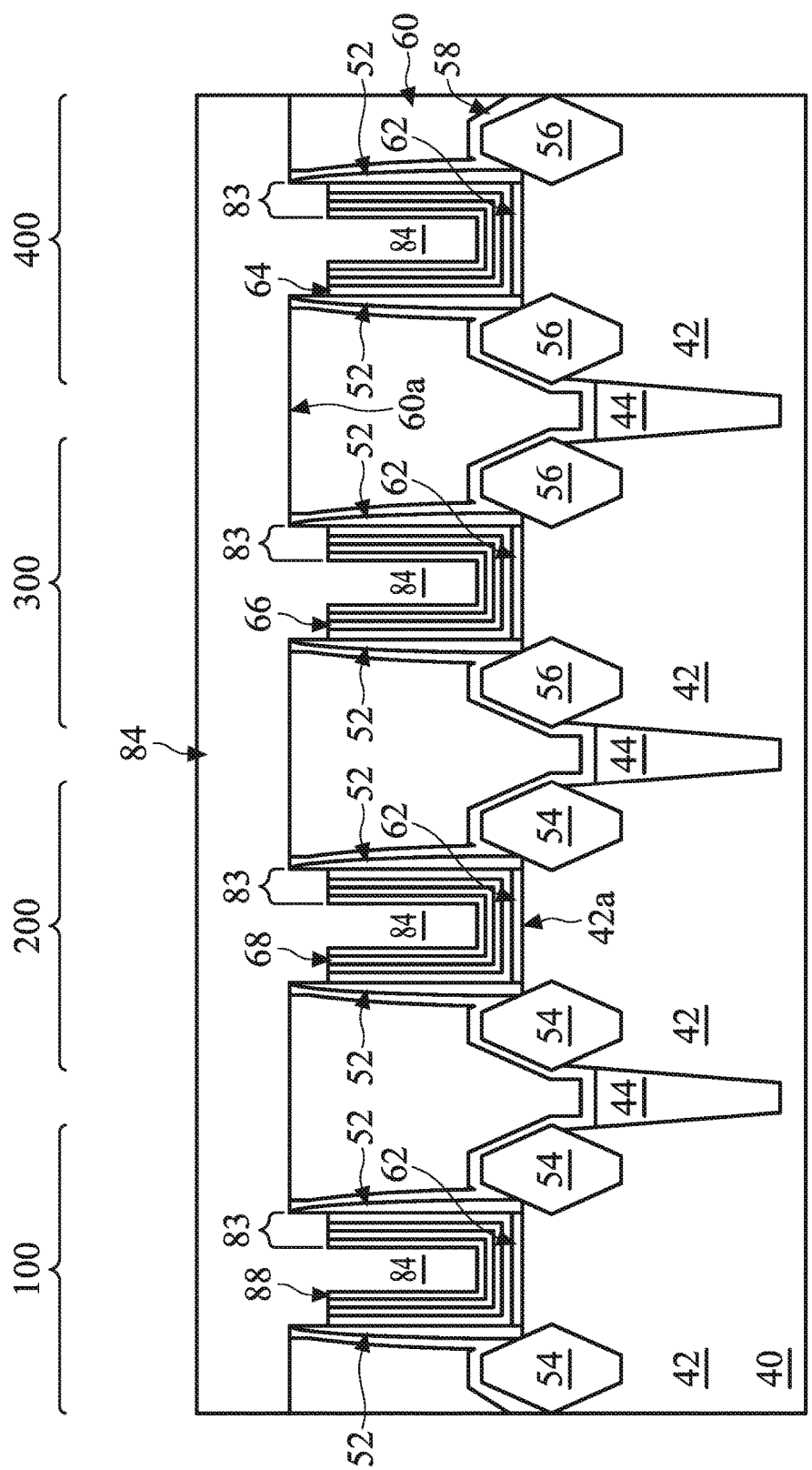

Referring to FIG. 22, a conductive material 84 is deposited in the openings, on the layered structures 83 and on the ILD0 60. The conductive material 84 may include a metal, such as tungsten (W), aluminum (Al), cobalt (Co), ruthenium (Ru), combinations thereof or the like. In some other examples, conductive material 84 may include polysilicon. The conductive material 84 may be deposited using CVD, physical vapor deposition (PVD), the like, or a combination thereof. As an example, the CVD process used to deposit conductive material 84 may be a low-pressure chemical vapor deposition (LPCVD) or a plasma enhanced chemical vapor deposition (PECVD). The conductive material 84 at least fills portions of the recesses 59 not filled by the layered structures 83. The conductive material 84 and the layered structures 83 may, together, form a gate structure that may be used for the fins 42. In depositing conductive material 84, voids may be avoided because the conductive material 84 (e.g. metal) may accumulate at the bottom of the openings at a faster rate in comparison to accumulation on sidewalls of the openings. Furthermore, in some embodiments, the process used to deposit conductive material 84 in the openings may be controlled such that deposition rates in different directions may be varied so that uniform filling of the openings is achieved, thereby preventing formation of voids in conductive material 84.

Figure 23:
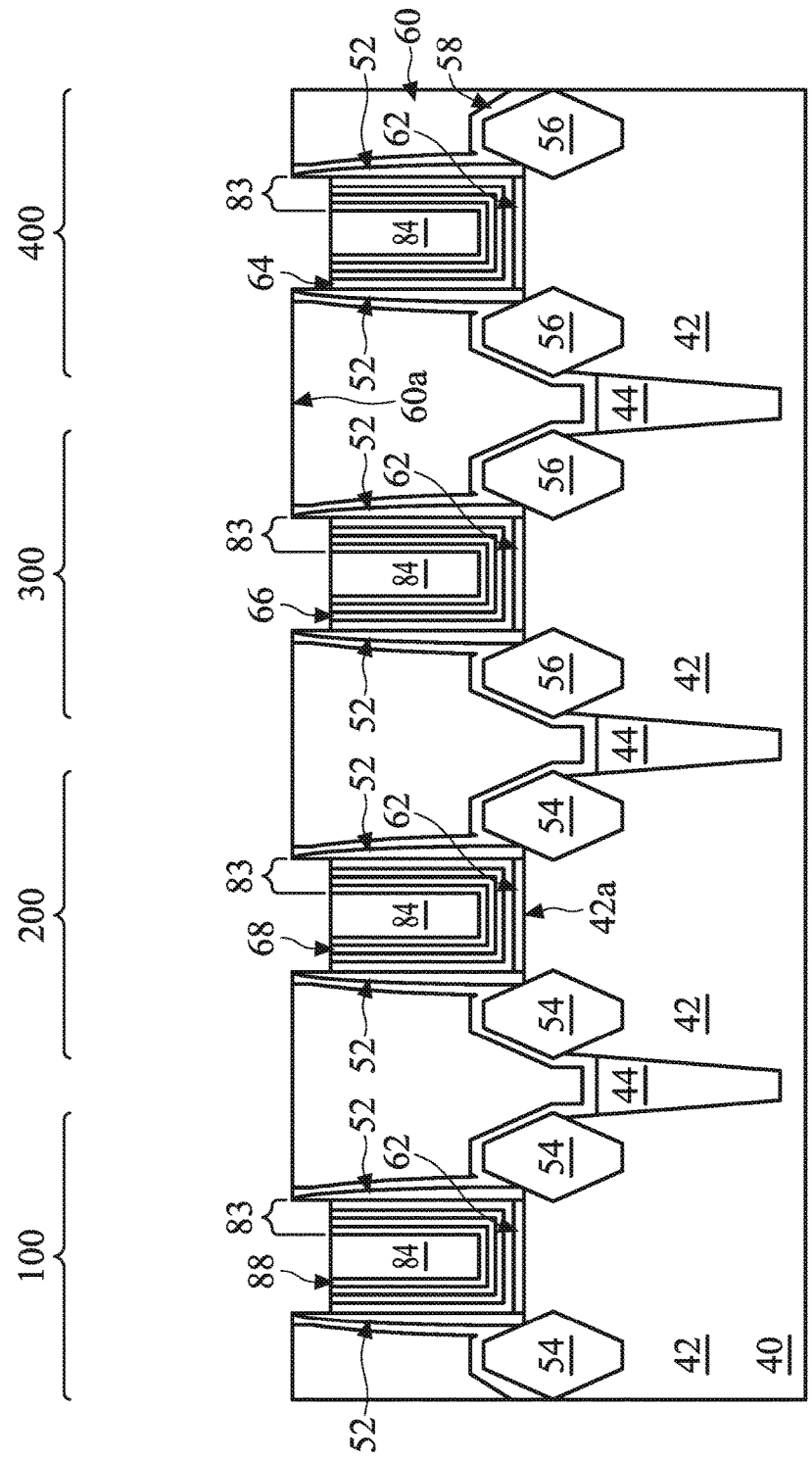

Referring to FIG. 23, a planarization process, such as a CMP, may be performed to remove the excess portions of conductive material 84, which excess portions are over the top surface of ILD0 60. A controlled etch-back selective to the conductive material 84, and possibly selective to the layered structures 83, may be subsequently performed to recess the conductive material 84 from the top surface of the ILD0 60, which results in the gate structures illustrated in FIG. 23.

Figure 24:
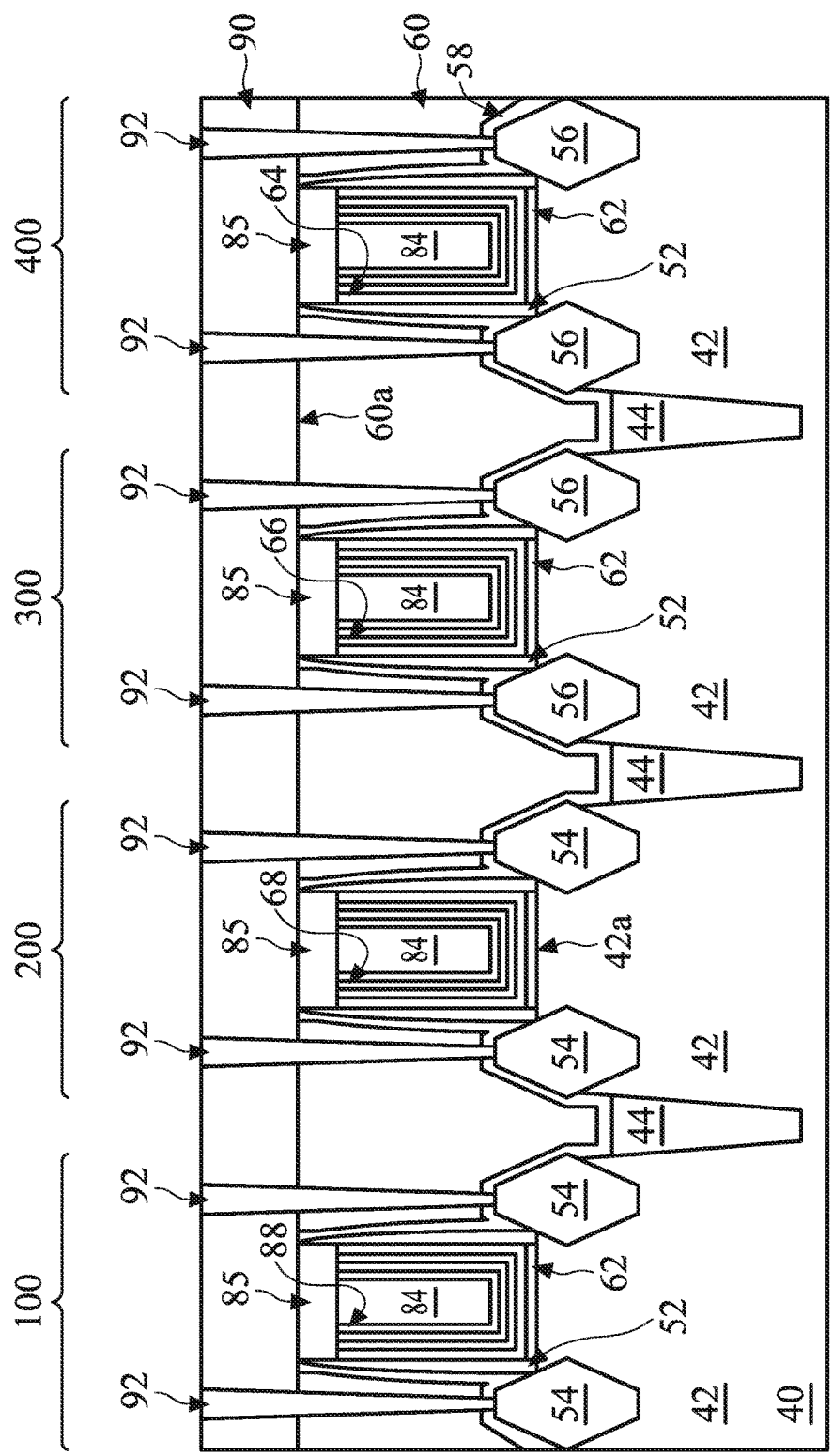

Referring to FIG. 24, dielectric caps 85 are formed on the conductive material 84 and the layered structures 83. To form the dielectric caps 85, a cap dielectric layer may be deposited in the remaining portions of the recesses 59 above the conductive material 84 and the layered structures 83, and on the top surface of the ILD0 60. The cap dielectric layer may include silicon nitride, silicon carbonitride, or the like, formed using CVD, PECVD, or the like. The cap dielectric layer may then be planarized, such as by CMP, to form top surfaces co-planar with the top surface of the ILD0 60 thereby forming the dielectric caps 85. Also shown in FIG. 24 is an upper ILD (ILD1) 90. The ILD1 90 may be deposited over the ILD0 60 and the dielectric caps 85, and contacts 92 are formed through the ILD1 90, ILD0 60, and ESL 58 to the epitaxial source/drain regions 54 and 56. ILD1 90 is formed of a dielectric material such as PSG, BSG, BPSG, USG, or the like, and may be deposited by any suitable method, such as CVD and PECVD. Openings for contacts 92 are formed through the ILD1 90, ILD0 60, and ESL 58. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD1 90. The remaining liner and conductive material form contacts 92 in the openings. An anneal process may be performed to form a silicide at the interface between the epitaxial source/drain regions 54 and 56 and the contacts 92, respectively.

Although not explicitly shown, a person having ordinary skill in the art readily understands that further processing steps may be performed on the structure in FIG. 24. For example, various inter-metal dielectrics (IMD) and their corresponding metallization may be formed over ILD1 90. Furthermore, the process flow depicted in the preceding figures is just one example of intermediate stages in the manufacturing of finFETs, and variations of the process flow described above are contemplated.

Some embodiments may achieve advantages. An embodiment method is provided such that a sacrificial dummy gate layer that is substantially free from voids is formed. The sacrificial dummy gate layer may subsequently be removed in a replacement gate process. As semiconductor process technology advances beyond the sub-20 nm node, the embodiment method may be needed so as to provide better gap-filling capabilities than conventional methods and to reduce or substantially eliminate voids formed in a sacrificial dummy gate layer. Due to the reduction or substantial elimination of voids in the sacrificial dummy gate layer, formation of residue (e.g. SiN residue) during or after removal of sacrificial dummy gate layer may be reduced or avoided, thereby improving manufacturing yield. The embodiment method of forming the sacrificial dummy gate layer may be applied to trenches located between neighboring finFETs that have a high aspect ratio (e.g. greater than or equal to about 7). The embodiment method of forming the sacrificial dummy gate layer may also be compatible with currently-available tools and processes such that new tool evaluation, calibration, and manufacture are avoided. Additionally, the embodiment method avoids use of precursor gases that may include at least one of silane ($SiH_4$), disilane ($Si_2H_6$), and dichlorosilane ($SiH_2Cl_2$), thereby preventing an increase in the cost of manufacturing semiconductor devices having finFETs.

In an embodiment, a method may include depositing a first conductive material in an opening disposed between a first semiconductor structure and a second semiconductor structure, the first conductive material comprising at least one first void; removing a portion of the first conductive material to form a trench, the trench exposing the at least one first void and defined by a remaining portion of the first conductive material; and depositing a second conductive material in the trench, the second conductive material and the remaining portion of the first conductive material forming a dummy gate layer, In an embodiment, a method may include forming a first dummy gate layer over a plurality of semiconductor fins, the first dummy gate layer having a first void disposed between neighboring ones of the plurality of semiconductor fins; etching a first portion of the first dummy gate layer over and around the first void to expose the first void and form a first tapered trench, the first tapered trench defined by a second portion of the first dummy gate layer remaining after the etching; and filling the first tapered trench with a conductive material to form a second dummy gate layer having a second void disposed between the neighboring ones of the plurality of semiconductor fins.

In an embodiment, a method may include forming a first dummy structure between adjacent semiconductor fins and over an isolation region disposed between the adjacent semiconductor fins, the first dummy structure having a first void disposed between the adjacent semiconductor fins; removing a portion of the first dummy structure having the first void to form a first dummy liner lining the adjacent semiconductor fins and the isolation region, wherein adjacent portions of the first dummy liner are separated by a first trench; and depositing material of the first dummy structure over the first dummy liner and into the first trench to form a second dummy structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   depositing an amorphous material in an opening disposed between a first semiconductor structure and a second semiconductor structure, the amorphous material comprising at least one first void;
   recrystallizing the amorphous material to form a first conductive material comprising the at least one void;
   removing a portion of the first conductive material to form a trench, the trench exposing the at least one first void and being defined by a remaining portion of the first conductive material; and
   depositing a second conductive material in the trench, the second conductive material and the remaining portion of the first conductive material forming a dummy gate layer, wherein depositing the second conductive material in the trench is sufficient to cause the dummy gate layer to be free from voids.

2. The method of claim 1, wherein the first conductive material and the second conductive material comprise at least one of polycrystalline-silicon or polycrystalline silicon-germanium.

3. The method of claim 1, wherein the first semiconductor structure and the second semiconductor structure comprises a first fin structure and a second fin structure, respectively.

4. The method of claim 1, wherein an aspect ratio of the trench is between about 1.5 times to about 5 times less than an aspect ratio of the opening.

5. The method of claim 1, wherein the opening is defined by a dummy dielectric layer lining the first semiconductor structure, the second semiconductor structure, and an isolation region disposed between the first semiconductor structure and the second semiconductor structure.

6. The method of claim 1, wherein the depositing of the first conductive material in the opening comprises at least one of a physical vapor deposition, a chemical vapor deposition, or a sputter deposition.

7. The method of claim 1, wherein the removing of the portion of the first conductive material comprises an etch process.

8. The method of claim 7, wherein the etch process comprises a halogen-containing precursor.

9. The method of claim 8, wherein the halogen-containing precursor comprises a chlorine-containing precursor.

10. A method, comprising:
    forming a first dummy gate layer over a plurality of semiconductor fins, the first dummy gate layer having a first void disposed between neighboring ones of the plurality of semiconductor fins;
    first etching a first portion of the first dummy gate layer over and around the first void to expose the first void and form a first tapered trench, the first tapered trench being defined by a second portion of the first dummy gate layer remaining after the first etching;
    filling the first tapered trench with a conductive material to form a second dummy gate layer having a second void disposed between the neighboring ones of the plurality of semiconductor fins;
    second etching a first portion of the second dummy gate layer over and around the second void to expose the second void and form a second tapered trench, the second tapered trench defined by a second portion of the second dummy gate layer remaining after the second etching; and filling the second tapered trench with the conductive material to form a sacrificial dummy gate structure, wherein filling the second tapered trench with the conductive material is sufficient to cause the sacrificial dummy gate structure to be free from voids disposed between the neighboring ones of the plurality of semiconductor fins.

11. The method of claim 10, wherein the plurality of semiconductor fins protrude from a substrate, and wherein the first void is located closer to a major surface of the substrate than the second void.

12. The method of claim 10, wherein the second portion of the first dummy gate layer lines the plurality of semiconductor fins.

13. The method of claim 10, wherein a distance between the neighboring ones of the plurality of semiconductor fins is greater than about 7 nanometers and less than about 10 nanometers.

14. The method of claim 10, wherein the first dummy gate layer and the conductive material comprise a material other than a doped semiconductor material.

15. The method of claim 10, wherein filling the first tapered trench and the second tapered trench with the conductive material comprises a deposition process other than an epitaxial process.

16. A method, comprising:
forming a first dummy structure between adjacent semiconductor fins and over an isolation region disposed between the adjacent semiconductor fins, the first dummy structure having a first void disposed between the adjacent semiconductor fins;
removing a portion of the first dummy structure having the first void to form a first trench and a first dummy liner lining the first trench, the first trench being disposed between the adjacent semiconductor fins;
depositing material of the first dummy structure over the first dummy liner and into the first trench to form a second dummy structure comprising a second void disposed between the adjacent semiconductor fins;
removing a portion of the second dummy structure having the second void to form a second trench and a second dummy liner lining the second trench; and
depositing material of the first dummy structure over the second dummy liner and into the second trench to form a sacrificial dummy gate free from voids, wherein depositing material of the first dummy structure over the second dummy liner and into the second trench is sufficient to cause the sacrificial dummy gate to be free from voids.

17. The method of claim 16, wherein the forming of the first dummy structure comprises a deposition process.

18. The method of claim 16, wherein the removing of the portion of the first dummy structure having the first void comprises an anisotropic etch process.

19. The method of claim 16, wherein a distance between the adjacent semiconductor fins is less than about 20 nanometers.

20. The method of claim 16, wherein the depositing material of the first dummy structure comprises at least one of a physical vapor deposition, a chemical vapor deposition, or a sputter deposition.

* * * * *